US008975529B2

(12) United States Patent
Hayashi

(10) Patent No.: US 8,975,529 B2
(45) Date of Patent: Mar. 10, 2015

(54) INTERPOSER AND ELECTRONIC DEVICE USING THE SAME

(75) Inventor: Katsura Hayashi, Yasu (JP)

(73) Assignee: Kyocera Corporation, Kyoto (JP)

( * ) Notice: Subject to any disclaimer, the term of this patent is extended or adjusted under 35 U.S.C. 154(b) by 263 days.

(21) Appl. No.: 13/638,351

(22) PCT Filed: Mar. 25, 2011

(86) PCT No.: PCT/JP2011/057372
§ 371 (c)(1),
(2), (4) Date: Oct. 2, 2012

(87) PCT Pub. No.: WO2011/125546
PCT Pub. Date: Oct. 13, 2011

(65) Prior Publication Data
US 2013/0027895 A1   Jan. 31, 2013

(30) Foreign Application Priority Data

Mar. 31, 2010  (JP) .................................. 2010-080808

(51) Int. Cl.
*H05K 1/11* (2006.01)
*H05K 1/16* (2006.01)
(Continued)

(52) U.S. Cl.
CPC ........ *H01L 23/49827* (2013.01); *H01L 23/145* (2013.01); *H01L 25/0657* (2013.01);
(Continued)

(58) Field of Classification Search
CPC ...... H05K 1/111; H05K 1/144; H05K 1/0306
USPC .................. 174/255, 256, 258, 26; 361/760
See application file for complete search history.

(56) References Cited

U.S. PATENT DOCUMENTS

| 2002/0066952 A1 | 6/2002 | Taniguchi et al. |
| 2009/0093117 A1 | 4/2009 | Taguchi et al. |

(Continued)

FOREIGN PATENT DOCUMENTS

| JP | H0664090 A | 3/1994 |
| JP | 11214449 | 8/1999 |

(Continued)

OTHER PUBLICATIONS

International Search Report, PCT/JP2011/057372, Jun. 2, 2011, 2 pp.

(Continued)

*Primary Examiner* — Hoa C Nguyen
*Assistant Examiner* — Amol Patel
(74) *Attorney, Agent, or Firm* — Volpe and Koenig, P.C.

(57) ABSTRACT

There is provided an interposer which meets the need of improving electrical reliability of an electronic device. An interposer includes a substrate including a penetrating-hole in a thickness direction thereof, and a penetrating conductor disposed in the penetrating-hole. The substrate includes a first insulating layer and a second inorganic insulating layer which are separated from each other in the thickness direction, and a first resin layer interposed between the first inorganic insulating layer and the second inorganic insulating layer and being in contact with the first inorganic insulating layer and the second inorganic insulating layer. A coefficient of thermal expansion of the first resin layer in thickness and planar directions thereof is larger than those of the first inorganic insulating layer and the second inorganic insulating layer.

14 Claims, 9 Drawing Sheets

(51) Int. Cl.
H05K 7/06 (2006.01)
H05K 1/02 (2006.01)
H01L 23/498 (2006.01)
H01L 23/14 (2006.01)
H01L 25/065 (2006.01)
H01L 25/10 (2006.01)
H01L 23/00 (2006.01)
H01L 23/48 (2006.01)

(52) U.S. Cl.
CPC ........ H01L25/105 (2013.01); H01L 23/49822 (2013.01); H01L 23/49894 (2013.01); *H01L 24/13* (2013.01); *H01L 24/16* (2013.01); *H01L 2225/06517* (2013.01); *H01L 2225/06541* (2013.01); *H01L 2225/06572* (2013.01); *H01L 2924/01004* (2013.01); *H01L 2924/0102* (2013.01); *H01L 2924/01078* (2013.01); *H01L 2924/01079* (2013.01); *H01L 2924/15311* (2013.01); *H01L 2924/15331* (2013.01); *H01L 2924/1579* (2013.01); *H01L 2924/15798* (2013.01); *H01L 2924/10342* (2013.01); *H01L 23/481* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/16227* (2013.01); *H01L 2224/16235* (2013.01); *H01L 2924/10252* (2013.01); *H01L 2924/10253* (2013.01); *H01L 2924/10272* (2013.01); *H01L 2924/10329* (2013.01); *H01L 2924/1033* (2013.01); *H01L 2924/14* (2013.01); *H01L 2924/1431* (2013.01); *H01L 2924/1432* (2013.01); *H01L 2924/1434* (2013.01); *H01L 2924/15172* (2013.01); *H01L 2924/15192* (2013.01); *H01L 2225/06548* (2013.01); *H01L 2924/01012* (2013.01); *H01L 2225/1023* (2013.01); *H01L 2225/1058* (2013.01); *H01L 23/49816* (2013.01); *H01L 2224/16225* (2013.01)
USPC .......... 174/256; 174/255; 174/258; 174/260; 361/760

(56) References Cited

U.S. PATENT DOCUMENTS

| | | | |
|---|---|---|---|
| 2009/0115050 | A1 | 5/2009 | Kasuya et al. |
| 2010/0259910 | A1 | 10/2010 | Hayashi et al. |
| 2010/0276796 | A1* | 11/2010 | Andry et al. .................. 257/692 |
| 2011/0156226 | A1 | 6/2011 | Kasuya et al. |

FOREIGN PATENT DOCUMENTS

| | | | |
|---|---|---|---|
| JP | 2000277917 | A | 10/2000 |
| JP | 2001144444 | A | 5/2001 |
| JP | 2002009227 | | 1/2002 |
| JP | 2002170906 | | 6/2002 |
| JP | 2003055036 | A | 2/2003 |
| JP | 2004311574 | | 11/2004 |
| JP | 2006285226 | | 10/2006 |
| JP | 2006285226 | A * | 10/2006 |
| JP | 2006339596 | A | 12/2006 |
| JP | 2007294927 | | 11/2007 |
| JP | 2007294927 | A * | 11/2007 |
| JP | 2007317711 | | 12/2007 |
| JP | 2007317711 | A * | 12/2007 |
| JP | 2009094217 | A | 4/2009 |

OTHER PUBLICATIONS

Japanese Office Action with English Concise Explanation, Japanese Patent Appln. No. 2013-142103, May 13, 2014, 4 pp.
Chinese Office Action with English concise explanation, Chinese Patent Appln. No. 201180016160.X, Sep. 3, 2014, 8 pp.

* cited by examiner (a)

(b)

(a)

(b)

(c)

(a)

(b)

(c)

(d)

(a)

(b)

(c)

(a)

(b)

INTERPOSER AND ELECTRONIC DEVICE USING THE SAME

FIELD OF INVENTION

The present invention relates to an interposer used in electronic apparatuses (such as various audio-visual apparatuses, household electrical appliances, communication apparatuses, and computers and peripherals thereof) or the like and an electronic device using the interposer.

BACKGROUND

Conventionally, electronic devices including a circuit board and electronic components mounted on the circuit board have been used in electronic apparatuses.

Japanese Unexamined Patent Publication JP-A 11-214449 (1999) discloses an electronic device including a circuit board and a bare chip mounted on the circuit board in a flip-chip manner.

In this way, when a bare chip is flip-chip mounted on a circuit board and heat is applied to the electronic device at the time of mounting the bare chip or during working, thermal stress may be generated in a connecting portion of the circuit board and the bare chip due to the difference in coefficient of thermal expansion between the circuit board and the bare chip, the thermal stress may be applied to electrodes of the bare chip having low durability to break the electrodes, and the electrical reliability of the electronic device may be easily lowered.

On the other hand, Japanese Unexamined Patent Publication JP-A 2004-311574 discloses an electronic device including a circuit board, an electronic element mounted on the circuit board, and an interposer interposed between the circuit board and the electronic element, wherein the interposer includes a substrate formed of an inorganic material (inorganic insulating material) having an insulating property, and a conductor-built-in through-hole penetrating the substrate and having a conductor filled in a penetrated portion.

In this way, since the interposer having a substrate formed of an inorganic insulating material can more easily reduce the difference in coefficient of thermal expansion from that of the electronic element, compared with the circuit board, thermal stress generated in the connecting portion between the interposer and the electronic element can be reduced and the thermal stress applied to electrodes of the electronic element can be reduced.

However, the inorganic insulating material having a small difference of the coefficient of thermal expansion from that of the electronic element has a smaller coefficient of thermal expansion than that of the conductor. Accordingly, when heat is applied to the electronic device, the conductor-built-in through-hole may thermally expand more than the substrate, the conductor may be peeled off from the inner wall of the through-hole and protrude from the substrate, and the connecting portion between the interposer and the electronic element may be broken due to the protrusion, thereby easily lowering the electrical reliability of the electronic device.

Therefore, there is a need for providing an interposer with improved electrical reliability.

SUMMARY

Technical Problem

The invention provides an interposer with improved electrical reliability to meet the need mentioned above.

Solution to Problem

An interposer according to an aspect of the invention includes: a substrate including a penetrating-hole in a thickness direction thereof; and a penetrating conductor disposed in the penetrating-hole, wherein the substrate includes first and second inorganic insulating layers separated from each other in the thickness direction and a first resin layer interposed between the first and second inorganic insulating layers and being in contact with the first and second inorganic insulating layers, and a coefficient of thermal expansion of the first resin layer in thickness and planar directions thereof being larger than those of the first and second inorganic insulating layers.

Advantageous Effects of Invention

According to the configuration, it is possible to provide an interposer with improved electrical reliability.

DETAILED DESCRIPTION OF THE PREFERRED EMBODIMENTS

First Embodiment

Hereinafter, an electronic device including an interposer according to a first embodiment of the invention will be described in detail with reference to the accompanying drawings.

Figure 1:
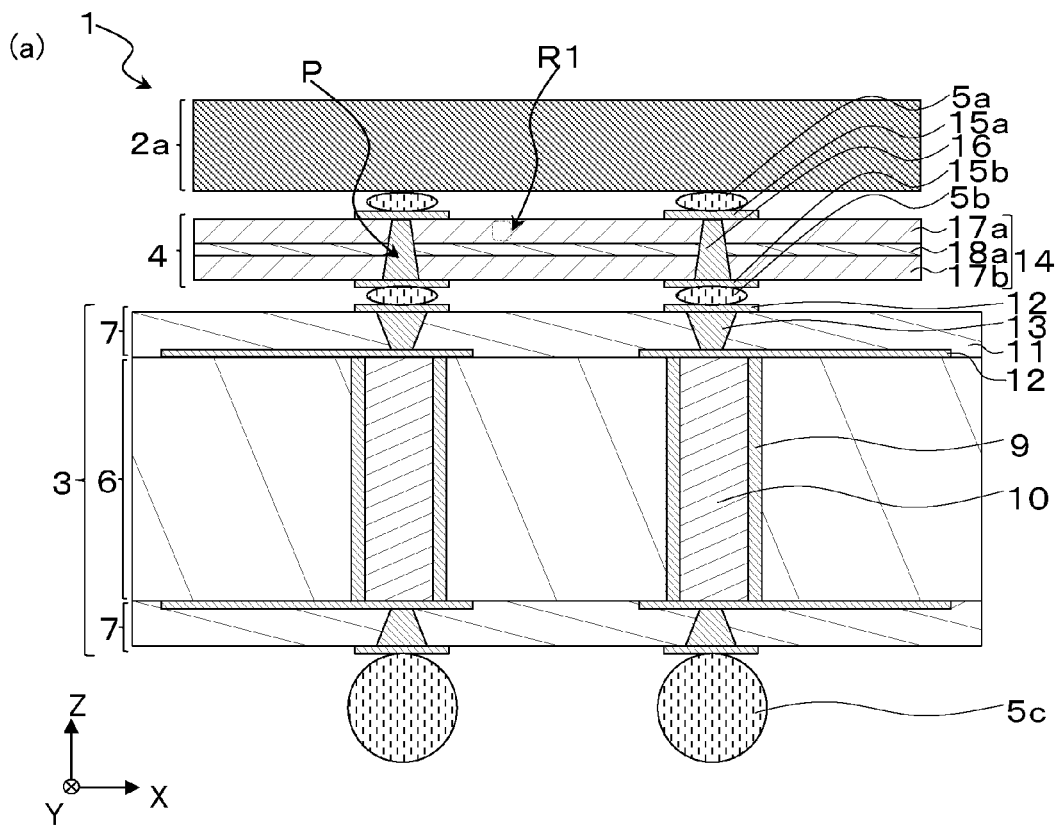
FIG. 1(a) is a cross-sectional view of an electronic device according to a first embodiment of the invention taken along a thickness direction thereof.
FIG. 1(b) is an enlarged view of a section R1 in FIG. 1.
FIG. 1(c) is a diagram schematically illustrating a state where two first inorganic insulating particles are connected to each other.
Figure 1:
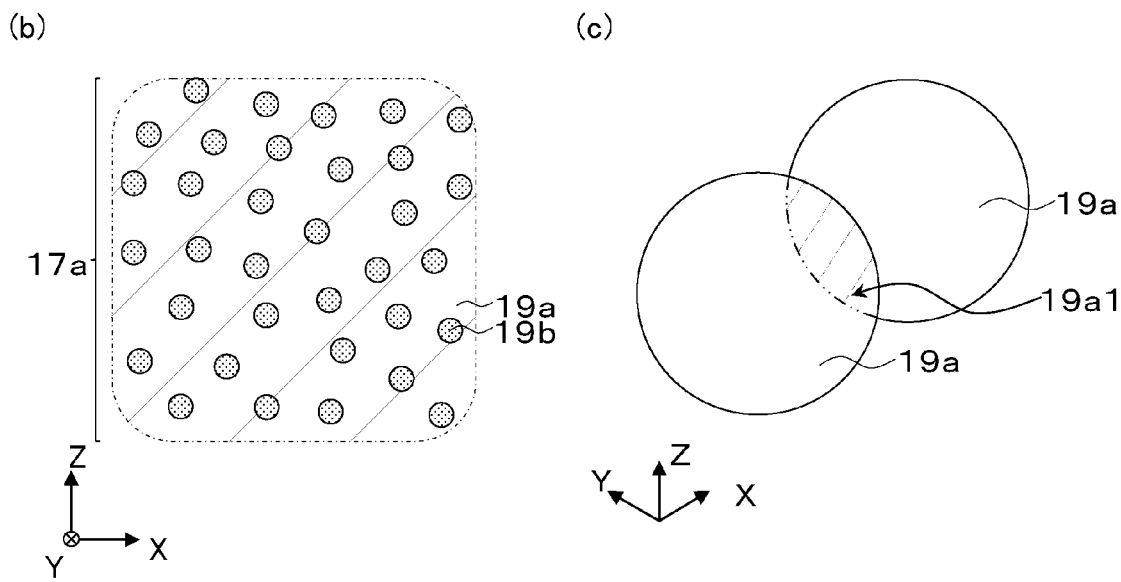

An electronic device 1 shown in FIG. 1(a) is used for electronic apparatuses such as various audio-visual apparatuses, household electrical appliances, communication apparatuses, and computers and peripherals thereof and is electrically connected to an external circuit such as a mother board.

The electronic device 1 includes an electronic component 2, a circuit board 3 on which the electronic component 2 is mounted, an interposer 4 interposed between the electronic component 2 and the circuit board 3, first bumps 5a electrically connecting the interposer 4 and the electronic component 2, second bumps 5b electrically connecting the interposer 4 and the circuit board 3, and third bumps 5c electrically connecting the circuit board 3 and an external circuit.

The electronic component 2 is mounted on the circuit board 3 with the interposer 4 interposed therebetween and is, for example, a semiconductor device such as an LSI or an IC. This semiconductor device may be a logic-type or memory-type semiconductor device such as a CPU or an MPU and the base material thereof includes a semiconductor material such as silicon, germanium, gallium arsenide, gallium arsenide phosphide, gallium nitride, or silicon carbide. In the electronic component 2, the thickness is set to, for example, a range of 0.05 mm or more and 0.8 mm or less, a coefficient of thermal expansion in a planar direction and a thickness direction thereof is set to a range of 3 ppm/° C. or more and 5 ppm/° C. or less, and the Young's modulus is set to a range of 100 GPa or more and 150 GPa or less.

In the electronic device 1 according to this embodiment, the electronic component 2 is preferably a logic-type semiconductor device. The logic-type semiconductor device has a larger number of terminals and finer wirings than a memory-type semiconductor device. Accordingly, since a circuit can be easily disconnected with an application of stress, the electrical connection reliability to the circuit board 3 can be easily lowered. Therefore, by interposing the interposer 4 between the electronic component 2 and the circuit board 3, the stress applied to the circuit of the electronic component 2 can be reduced, thereby improving the electrical connection reliability between the electronic component 2 and the circuit board 3.

The coefficient of thermal expansion is measured using a commercially-available TMA apparatus through a measurement method based on JIS K7197-1991. The Young's modulus is measured using the Nano Indentor XP/DCM made by MTS systems Corp. Hereinafter, the coefficients of thermal expansion and the Young's moduli of the constituent members are measured in the same way as the electronic component 2.

The circuit board 3 is a build-up board formed of a resin and includes a core substrate 6 and a pair of build-up portions 7 formed on the top and bottom of the core substrate 6. The thickness of the circuit board 3 is set to a range of 0.3 mm or more and 1.8 mm or less, the thickness is set to a range of 2 times or more and 20 times or less the thickness of the electronic component 2, the coefficient of thermal expansion in the planar direction is set to a range of 15 ppm/° C. or more and 25 ppm/° C. or less, the coefficient of thermal expansion in the thickness direction is set to a range of 20 ppm/° C. or more and 40 ppm/° C. or less, the coefficient of thermal expansion in the planar direction is set to a range of 3 times or more and 8 times or less the thickness of the electronic component 2, and the Young's modulus is set to a range of 5 GPa or more and 40 GPa or less.

The core substrate 6 serves to enhance the rigidity of the circuit board 3 and includes a resin substrate 8 including through-holes penetrating the substrate in the thickness direction thereof, through-hole conductors 9 formed in a cylindrical shape along the inner wall of the through-holes, and insulators 10 formed in a columnar shape in the corresponding through-hole conductor 9. The core substrate 6 has, for example, a thickness in a range of 0.2 mm or more and 1.2 mm or less.

The resin substrate 8 serves to enhance the rigidity of the core substrate 6 and includes a resin material such as an epoxy resin. The resin substrate may include an inorganic insulating filler or a base material formed of fiber. The through-holes penetrating the resin substrate 8 are formed in a cylindrical shape, for example, having a diameter of 0.1 mm or more and 1 mm or less.

The through-hole conductor 9 serves to electrically connect the top and bottom build-up portions 7 of the core substrate 6 and includes a conductive material such as copper. In the through-hole conductor 9, the thickness from the inner wall of the through-hole to the boundary of the insulator 10 is set to, for example, a range of 15 μm or more and 100 μm or less.

The insulator 10 forms a support surface of the via conductor 13 described later and includes a resin material such as an epoxy resin.

On the other hand, the build-up portions 7 each include an insulating layer 11 provided with via holes penetrating in the thickness direction thereof and disposed on the core substrate 6, circuit layers 12 disposed on the core substrate 6 or the insulating layer 11, and via conductors 13 formed in a columnar shape in the via holes and electrically connected to the circuit layers 12. The circuit layers 12 and the via conductors 13 are electrically connected to each other and constitute a wiring portion including a ground line, a power supply line and/or a signal line.

The insulating layer 11 has a function as a support member of the circuit layers 12 and a function as an insulating member suppressing short-circuit between the circuit layers 12. The insulating layer 11 includes a resin material such as an epoxy resin.

The circuit layers 12 are separated from each other in the thickness direction via the insulating layer 11 and include a conductive material such as copper.

The via conductor 13 serves to connect the circuit layers 12 separated in the thickness direction, is formed in a columnar shape in which the sectional area in the planar direction decreases toward the core substrate 6 (tapered shape), and includes a conductive material such as copper. The sectional area in the planar direction of the via conductor 13 is set to, for example, a range of 0.001 $mm^2$ or more and 0.01 $mm^2$ or less.

The interposer 4 serves as a connection member of the electronic component 2 and the circuit board 3 and includes a substrate 14 including penetrating-holes P along the thickness direction, a first conductive layer 15a being in contact with one main surface of the substrate 14, a second conductive layer 15b being in contact with the other main surface of the substrate 14, and penetrating conductors 16 filled in the penetrating-holes P and electrically connected to the first conductive layer 15a and the second conductive layer 15b.

Further, the thickness of the interposer 4 is set to be smaller than those of the electronic component 2 and the circuit board 3. As a result, since the thickness of the interposer 4 is small, it is possible to reduce the thickness of the electronic device 1 and to reduce the wiring length between the electronic component 2 and the circuit board 3, thereby improving signal transmission characteristics. By reducing the thickness of the interposer 4, the interposer may be easily deformed due to external stress. Accordingly, for example, when the electronic component 2 thermally expands, the interposer 4 can be deformed to alleviate the stress applied to the connection portion to the electronic component 2, thereby improving the electrical connection reliability to the electronic component 2.

Here, in the interposer 4, the thickness is set to, for example, a range of 0.2 time or more and 0.8 time or less the thickness of the electronic component 2 and is set to, for example, 0.015 time or more and 0.5 time or less the thickness of the circuit board 3. The thickness of the interposer 4 is set to, for example, a range of 0.03 mm or more and 0.15 mm or less.

The substrate 14 serves as a support member and an insulating member of the interposer 4 and includes a first inorganic insulating layer 17a, a second inorganic insulating layer 17b separated from the first inorganic insulating layer 17a in the thickness direction, and a first resin layer 18a interposed between the first inorganic insulating layer 17a and the second inorganic insulating layer 17b and being in contact with the first inorganic insulating layer 17a and the second inorganic insulating layer 17b. The Young's modulus of the substrate 14 is set to a range of 100 GPa or more and 150 GPa or less.

Since the first inorganic insulating layer 17a includes an inorganic insulating material having a low coefficient of thermal expansion and a high rigidity as a major component, the substrate 14 has a low coefficient of thermal expansion and a high rigidity. The inorganic insulating material can employ a ceramic material including silicon oxide as a major component and may further include aluminum oxide, magnesium oxide, potassium oxide, aluminum nitride, aluminum hydroxide, or calcium carbonate. First inorganic insulating particles 11a preferably contain silicon oxide in a content range of 65 wt % or more and 100 wt % or less.

This inorganic insulating material is preferably in an amorphous state. As a result, the anisotropy of the coefficient of thermal expansion due to the crystalline structure of the first inorganic insulating layer 17a can be reduced. Accordingly, when heat is applied to the electronic device 1, the contraction of the first inorganic insulating layer 17a can be made uniform in all directions at the time of heating and then cooling the electronic device, thereby improving the electrical connection reliability between the interposer 4 and the electronic component 2.

The crystalline phase region in the amorphous inorganic insulating material is set to be, for example, less than 10 vol % and is preferably set to be less than 5 vol %. The volume ratio of the crystalline phase region in the inorganic insulating material is measured as follows. First, by preparing plural comparative samples including sample powder crystallized at 100% and amorphous powder at different ratios and measuring the comparative samples through the use of X-ray diffractometry, a calibration curve is prepared which represents the relative relationship between the measured values and the volume ratio of the crystalline phase region. Then, an inspection sample as a measurement target is measured through the use of X-ray diffractometry, the measured value is compared with the calibration curve, and the volume ratio of the crystalline phase region of the inspection sample is measured by calculating the volume ratio of the crystalline phase region from the measured value.

The thickness of the first inorganic insulating layer 17a is set to a range of 0.011 mm or more and 0.07 mm or less. In the first inorganic insulating layer 17a, the coefficient of thermal expansion in the planar direction and the thickness direction is set to a range of 0 ppm/° C. or more and 7 ppm/° C. or less and the Young's modulus is set to, for example, a range of 10 GPa or more and 150 GPa or less. The first inorganic insulating layer 17a includes an inorganic insulating material, for example, in a range of 97 vol % or more and 100 vol % or less and includes a balance of a resin material and voids, for example, in a range of larger than 0 vol % and 3 vol % or less other than the inorganic insulating material.

The first inorganic insulating layer 17a includes first inorganic insulating particles 19a and second inorganic insulating particles 19b, as shown in FIG. 1(b). The first inorganic insulating particles 19a and the second inorganic insulating particles 19b can be formed of the same inorganic insulating material as forming the first inorganic insulating layer 17a.

The first inorganic insulating particles 19a have a particle diameter set to, for example, a range of 3 nm or more and 110 nm or less and are connected to each other via boundaries as shown in FIG. 1(c). As a result, since the first inorganic insulating layer 17a can be formed densely, it is possible to enhance the flatness of the first inorganic insulating layer 17a and to improve the electrical connection reliability between the interposer 4 and the electronic component 2.

The second inorganic insulating particles 19b has a particle diameter larger than that of the first inorganic insulating particles 19a and the particle diameter is set to, for example, a range of 0.5 μm or more and 5 μm or less. The second inorganic insulating particles are connected to each other via the first inorganic insulating particles 19a. As a result, when a crack generated in the first inorganic insulating layer 17a grows and the crack reaches the second inorganic insulating particle 19b having a large surface area, the stress of the crack is dispersed on the surface of the second inorganic insulating particle 19b. Accordingly, it is possible to suppress the growth of the crack and to enhance the insulating property of the first inorganic insulating layer 17a.

The first inorganic insulating particles 19a and the second inorganic insulating particles 19b are detected by observing a polished surface or a broken-out surface of the first inorganic insulating layer 17a through the use of a field-emission electron microscope. The particle diameters of the first inorganic insulating particles 19a and the second inorganic insulating particles 19b are measured by observing the polished surface or the broken-out surface of the first inorganic insulating layer 17a through the use of the field-emission electron microscope, imaging an enlarged section to include 20 particles or more and 50 particles or less, and measuring the maximum diameter of the particles in the enlarged section.

The first inorganic insulating particles 19a preferably have a spherical shape. As a result, the filling density of the first inorganic insulating particles 19a can be raised to more strongly connect the first inorganic insulating particles 19a and to enhance the rigidity of the first inorganic insulating layer 17a. The second inorganic insulating particles 19a preferably have a spherical shape. As a result, the stress on the surface of the second inorganic insulating particles 19b can be dispersed and the generation of cracks in the first inorganic insulating layer 17a with the surface of the second inorganic insulating particle 19b as a start point can be reduced.

The first inorganic insulating particles 19a and the second inorganic insulating particles 19b are preferably formed of the same material. As a result, in the first inorganic insulating layer 17a, the first inorganic insulating particles 19a and the second inorganic insulating particles 19b can be strongly connected, thereby reducing cracks due to the difference in material characteristics.

The second inorganic insulating layer 17b has the same configuration as the first inorganic insulating layer 17a described above.

On the other hand, the first resin layer 18a has a function of bonding the first inorganic insulating layer 17a and the second inorganic insulating layer 17b and includes a resin material and an inorganic insulating filler. The thickness of the first resin layer 18a is set to, for example, a range of 0.009 mm or more and less than 0.05 mm. In the first resin layer 18a, the coefficient of thermal expansion in the planar direction and the thickness direction is set to, for example, a range of 8 ppm/° C. or more and 20 ppm/° C. or less and the Young's modulus is set to, for example, a range of 5 GPa or more and 35 GPa or less.

The resin material included in the first resin layer 18a forms a main part of the first resin layer 18a and include resin materials such as an epoxy resin, a bismaleimidetriazine resin, a cyanate resin, a polyparaphenylenebenzobisoxazole resin, a wholly aromatic polyamide resin, a polyimide resin, an aromatic liquid crystal polyester resin, a polyetheretherketone resin, a polyetherketone resin, or a liquid crystal polymer.

The inorganic insulating filler included in the first resin layer 18a serves to reduce the coefficient of thermal expansion of the first resin layer 18a and to raise the rigidity of the first resin layer 18a and includes an inorganic insulating material such as silicon oxide, aluminum oxide, aluminum nitride, aluminum hydroxide, and calcium carbonate. In the particles of the inorganic insulating filler, the particle diameter is set to, for example, a range of 0.5 µm or more and 5.0 µm or less, the coefficient of thermal expansion is set to, for example, a range of 0 ppm/° C. or more and 15 ppm/° C. or less, and the content thereof in the first resin layer 18a is set to, for example, a range of 3 vol % or more and 70 vol % or less.

The particle diameter of the inorganic insulating filler is measured by observing a polished surface or a broken-out surface of the substrate 14 through the use of a field-emission electron microscope, imaging an enlarged section to include 20 particles or more and 50 particles or less, and measuring the maximum diameter of the particles in the enlarged section. The content (vol %) of the inorganic insulating filler in the resin part of the substrate 14 is measured by imaging the polished surface of the substrate 14 through the use of a field-emission electron microscope, measuring the area ratio (area %) of the inorganic insulating filler occupied in the resin part of the substrate 14 at ten sections through the use of an image analyzer, and calculating and considering the average of the measured values as the content (vol %).

The first conductive layer 15a has a function as a connection pad to the electronic component 2 and includes a conductive material such as copper, silver, gold, aluminum, nickel, chromium, tungsten, or molybdenum. The first conductive layer preferably includes copper from the viewpoint of conductivity or processability. Since the first conductive layer 15a is in contact with the first inorganic insulating layer 17aX which is a low dielectric tangent, it is possible to enhance the signal transmission characteristics.

The second conductive layer 15b has a function as a connection pad to the circuit board 4 and has the same configuration as the first conductive layer 15a.

The penetrating conductor 16 has a function of electrically connecting the first conductive layer 15a and the second conductive layer 16a to each other and includes a conductive material such as copper, silver, gold, aluminum, nickel, chromium, tungsten, or molybdenum. The penetrating conductor 16 preferably includes copper from the viewpoint of conductivity or processability. The sectional area of the penetrating conductor 16 in the planar direction is set to, for example, a range of 0.001 mm² or more and 0.01 mm² or less. In the penetrating conductor 16, the coefficients of thermal expansion in the planar direction and the thickness direction are set to a range of 12 ppm/° C. or more and 20 ppm/° C. or less and the Young's modulus is set to a range of 80 GPa or more and 200 GPa or less. When the penetrating conductor 16 includes copper, the coefficients of thermal expansion in the planar direction and the thickness direction of the penetrating conductor 16 are about 17 ppm/° C.

The penetrating conductor 16 is filled in the penetrating-hole P. As a result, even when the diameter of the penetrating-hole P becomes smaller to a small value, it is possible to suppress the disconnection of the penetrating conductor 16 and thus to enhance the electrical connection reliability between the circuit board 3 and the electronic component 2.

The penetrating conductor 16 is formed in a columnar shape in which the sectional area in the planar direction becomes smaller toward the electronic component 2 (tapered shape). As a result, the first conductive layer 15a can be reduced in size on the electronic component 2 side on which terminals are reduced in size. The penetrating conductor 16 is filled in the penetrating-hole P of a tapered shape. Accordingly, when heat is applied thereto, the penetrating conductor thermally expands in the planar direction and tends to move to a position at which the diameter in the penetrating-hole P is larger. Therefore, the penetrating conductor tends to move to an end of the tapered penetrating-hole P at which the sectional area in the planar direction is large. As a result, since the penetrating conductor 16 hardly protrudes from the end at which the sectional area in the planar direction is small, it is possible to suppress the protruding of the penetrating conductor 16 to the electronic component 2 by arranging the end of the penetrating conductor 16 at which the sectional area in the planar direction is small on the electronic component 2 side.

The first bump 5a serves as an electrical connection member between the electronic component 2 and the interposer 4, is interposed between the electronic component 2 and the first conductive layer 15a of the interposer 4, and is formed of a conductive material such as solder which includes lead, tin, silver, gold, copper, zinc, bismuth, indium, or aluminum.

The second bump 5b serves as an electrical connection member between the interposer 4 and the circuit board 3, is interposed between the second conductive layer 15b of the interposer 4 and the circuit layer 12 in the uppermost layer of the circuit board 3, and is formed of the same conductive material as the first bump 5a.

The third bump 5c serves as an electrical connection member between the circuit board 3 and an external circuit, is formed on the main surface of the circuit layer 12 in the lowermost layer of the circuit board 3, and is formed of the same conductive material as the first bump 5a.

The coefficient of thermal expansion in the planar direction of the electronic component 2 mounted on the substrate 14 of the interposer 4 is set to be smaller than the coefficient of thermal expansion in the thickness direction of the penetrating conductor 16 penetrating the substrate 14 in the thickness direction thereof. For example, the coefficient of thermal expansion in the planar direction of the electronic component 2 is set to a range of 0.2 time or more and 0.4 time or less the coefficient of thermal expansion in the thickness direction of the penetrating conductor 16.

On the other hand, in the interposer 4 according to this embodiment, the first resin layer 18a of which the coefficients of thermal expansion in the thickness direction and the planar direction are larger than those of the first inorganic insulating layer 17a and the second inorganic insulating layer 17b is interposed between the first inorganic insulating layer 17a and the second inorganic insulating layer 17b separated from each other in the thickness direction.

As a result, since the first inorganic insulating layer 17a and the second inorganic insulating layer 17b in the substrate 14 are disposed outside the first resin layer 18a and are close to both main surfaces of the substrate 14, their contribution to the coefficient of thermal expansion in the planar direction in the main surface of the substrate 14 is larger than that of the first resin layer 18a. Accordingly, it is easy to reduce the coefficient of thermal expansion in the planar direction on both main surfaces of the substrate 14. On the other hand, since the first inorganic insulating layer 17a, the first resin layer 18a, and the second inorganic insulating layer 17b in the substrate 14 are sequentially stacked in the thickness direction, their contributions to the coefficient of thermal expansion in the thickness direction in the inner wall of the penetrating-hole P of the substrate 14 are equivalent to each other and it is thus difficult to reduce the coefficient of thermal expansion in the thickness direction in the inner wall of the penetrating-hole of the substrate 14. Accordingly, the coefficient of thermal expansion in the planar direction on both main surfaces of the substrate 14 can be set to be smaller than the coefficient of thermal expansion in the thickness direction in the inner wall of the penetrating-hole P and it is possible to reduce the difference in coefficient of thermal expansion in the thickness direction between the substrate 14 and the penetrating conductor 16 while reducing the difference in coefficient of thermal expansion in the planar direction between the substrate 14 and the electronic component 2.

For this reason, when heat is applied to the electronic device 1 at the time of the mounting or the working of the electronic component 2, the thermal stress due to the difference in coefficient of thermal expansion in the planar direction between the substrate 14 and the electronic component 2 can be reduced to protect electrodes of the electronic component 2 having low durability from the thermal stress and the protruding of the penetrating conductor 16 from the main surface of the substrate 14 due to the difference in coefficient of thermal expansion in the thickness direction between the substrate 14 and the penetrating conductor 16 can be reduced to protect the first bump 5a on the penetrating conductor 16 from the protruding thereof. In addition, it is possible to enhance the electrical connection reliability between the interposer 4 and the electronic component 2 and thus to obtain an electronic device 1 with excellent electrical reliability.

The coefficient of thermal expansion in the thickness direction of the substrate 14 is set to, for example, a range of 3 times or more and 7 times or less that in the planar direction. In the substrate 14, the coefficient of thermal expansion in the planar direction is set to, for example, a range of 0.75 time or more and 1.25 times or less that of the electronic component 2 and the coefficient of thermal expansion in the planar direction is set to, for example, a range of 0.2 time or more and 0.4 time or less that of the circuit board 3. The coefficient of thermal expansion in the thickness direction of the substrate 14 is set to, for example, a range of 0.75 time or more and 1.25 times or less that of the penetrating conductor 16. In the substrate 14 of the interposer 4, the coefficient of thermal expansion in the planar direction is set to, for example, a range of 3 ppm/° C. or more and 7 ppm/° C. or less and the coefficient of thermal expansion in the thickness direction is set to, for example, a range of 10 ppm/° C. or more and 20 ppm/° C. or less.

In the penetrating conductor 16 filled in the penetrating-hole P, the volume of the penetrating conductor 16 with respect to the bonding area between the penetrating conductor 16 and the inner wall of the penetrating-hole P is larger, compared to a cylindrical penetrating conductor. Accordingly, when heat is applied to the electronic device 1, the penetrating conductor 16 thermally expands in the thickness direction and can be easily peeled off from the inner wall of the penetrating-hole P. However, in the interposer 4 according to this embodiment, it is possible to reduce the difference in coefficient of thermal expansion in the planar direction between the substrate 14 and the electronic component 2 and to reduce the difference in coefficient of thermal expansion in the thickness direction between the substrate 14 and the penetrating conductor 16. As a result, in the penetrating conductor 16 filled in the penetrating-hole P, it is possible to effectively reduce the protruding of the penetrating conductor 16 from the main surface of the interposer 4.

The thickness of the first resin layer 18a is preferably smaller than the total thickness of the first inorganic insulating layer 17a and the second inorganic insulating layer 17b and preferably smaller than the thicknesses of the first inorganic insulating layer 17a and the second inorganic insulating layer 17b. As a result, by raising the volume ratio of the first inorganic insulating layer 17a and the second inorganic insulating layer 17b in the substrate 14, it is possible to reduce the difference in coefficient of thermal expansion in the planar direction between the substrate 14 and the electronic component 2, to enhance the rigidity of the substrate 14, and to improve the electrical connection reliability between the interposer 4 and the electronic component 2. In addition, by reducing the thickness of the first resin layer 18a, it is possible to reduce the size of the interposer 4 and thus to improve the signal transmission characteristics.

The thickness of the first resin layer 18a is set to, for example, a range of 0.1 time or more and 0.9 time or less that of the first inorganic insulating layer 17a. In the first resin layer 18a, the coefficients of thermal expansion in the planar direction and the thickness direction are set to, for example, a range of 2 times or more and 7 times or less that of the first inorganic insulating layer 17a and the Young's modulus is set to a range of 0.03 time or more and 0.3 time or less that of the first inorganic insulating layer 17a.

The electronic device 1 performs a desired function by driving or controlling the electronic component 2 on the basis of power or signals supplied from the circuit board 3 via the interposer 4.

A method of manufacturing the electronic device 1 will be described below with reference to FIGS. 2 to 4.

Manufacturing of Circuit Board (1) A core substrate 6 is manufactured. Specifically, the core substrate is manufactured, for example, as follows.

First, plural resin sheets including an uncured resin and a base material are stacked, the stacked resin sheets are heated and pressed to cure the uncured resin, whereby a resin substrate 8 is manufactured. Here, the uncured state is a state of an A-stage or B-stage based on ISO 472:1999. Through-holes penetrating the resin substrate 8 in the thickness direction thereof are formed, for example, through the use of a drilling process or a laser process. A conductive material is attached on the inner wall of the through-holes, for example, through the use of electroless plating, electrical plating, vapor deposition, CVD, sputtering, or the like to form a through-hole conductor 9 having a cylindrical shape. A conductive material is attached to the upper surface and the lower surface of the resin substrate 8 to form a conductive material layer. A resin material or the like is filled in the inside of the through-hole conductor 9 of a cylindrical shape to form an insulator 10. A conductive material is attached to the exposed part of the insulator 10 and then the conductive material layer is patterned to form a circuit layer 12 through the use of known photolithographic techniques and etching.

In this way, the core substrate 6 shown in FIG. 2(a) can be manufactured.

(2) A pair of build-up portions 7 are formed on both sides of the core substrate 6 to manufacture a circuit board 5. Specifically, the circuit board is manufactured, for example, as follows.

First, by disposing an uncured resin on the circuit layer 12, heating the resin to flow and adhere, further heating the resin to cure the resin, an insulating layer 11 is formed on the circuit layer 12. Then, via holes are formed in the insulating layer 11, for example, through the use of a YAG laser device or an carbon dioxide laser device and at least a part of the circuit layer 12 is exposed from the via holes. Then, by forming a via conductor 13 in the via holes and forming the circuit layer 12 on the upper surface of the insulating layer 11, for example, through the use of a semi-additive method, a subtractive method, or a full additive method, the build-up portion 7 is formed. By repeating this process, the build-up portion 7 can be formed in which the insulating layers 11 are stacked.

Figure 2:
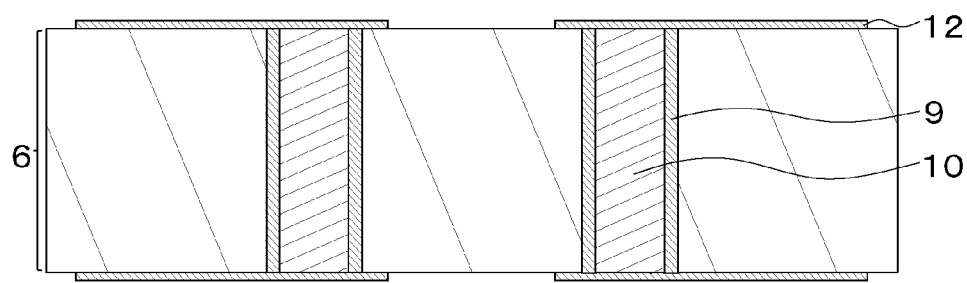
FIG. 2 is a cross-sectional view taken along the thickness direction, which illustrates processes of manufacturing the electronic device shown in FIG. 1.
Figure 2:
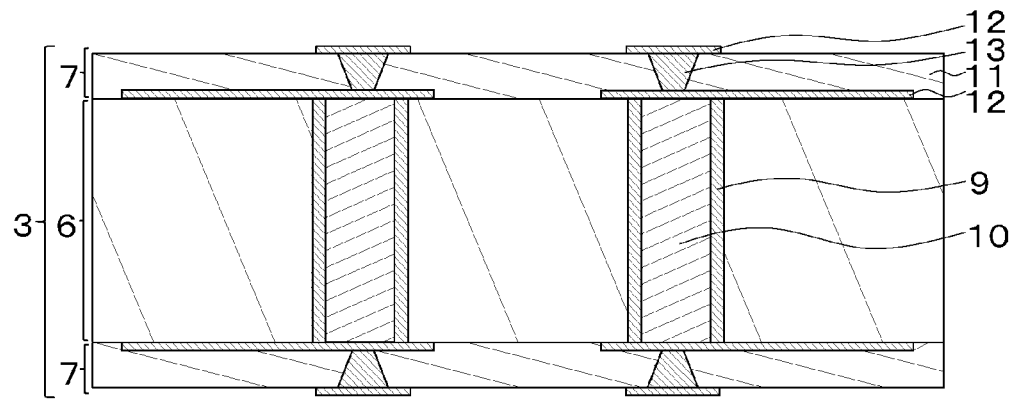

In this way, the circuit board 3 shown in FIG. 2(*b*) can be manufactured.

Figure 3:
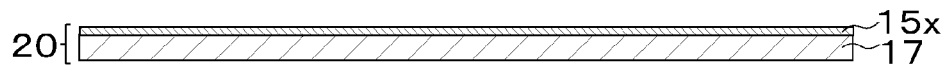
FIG. 3 is a cross-sectional view taken along the thickness direction, which illustrates processes of manufacturing the electronic device shown in FIG. 1.
Figure 3:
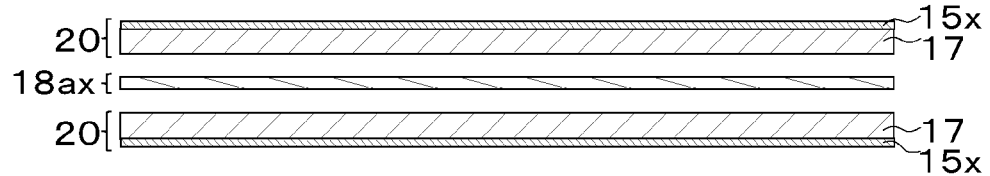
Figure 3:
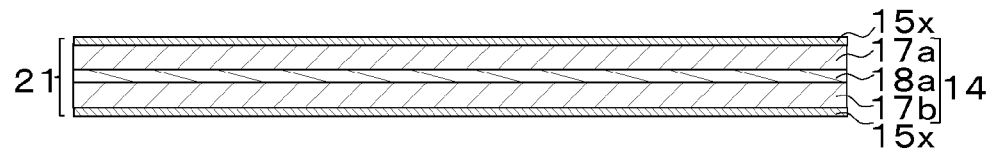

Manufacturing of Interposer (3) As shown in FIG. 3(*a*), an insulating sheet 20 including a copper foil 15*x* and an inorganic insulating layer 17 formed on the copper foil 15*x* is manufactured. Specifically, the insulating sheet is manufactured, for example, as follows.

First, a copper foil 15*x* and a first inorganic insulating sol including first inorganic insulating particles 19*a*, second inorganic insulating particles 19*b*, and a solvent are prepared and the first inorganic insulating sol is applied to one main surface of the copper foil 15*x*. Then, the first inorganic insulating sol is dried to vaporize the solvent, and the solid content of the first inorganic insulating sol is heated to connect the first inorganic insulating particles 19*a* to each other and to connect the first inorganic insulating particles 19*a* and the second inorganic insulating particles 19*b*, whereby the inorganic insulating layer 17 is formed on the copper foil 15*x*.

Here, when the first inorganic insulating sol is dried to vaporize the solvent, the first inorganic insulating particles 19*a* having a small particle diameter flows and thus the first inorganic insulating particles 19*a* and the second inorganic insulating particles 19*b* are filled in the largest density. Accordingly, it is possible to form an inorganic insulating layer 17 having high flatness and to manufacture an interposer 4 with excellent connection reliability to the electronic component 2.

Further, when heating the solid content of the first inorganic insulating sol, the first inorganic insulating particles 19*a* having a small particle diameter and capable of being easily connected are connected to each other and the first inorganic insulating particles 19*a* and the second inorganic insulating particles 19*b* are connected to each other. Accordingly, the second inorganic insulating particles 19*b* having a large particle diameter and hardly being connected can be connected to each other via the first inorganic insulating particles 19*a*. As a result, it is possible to form an inorganic insulating layer 17 with high rigidity and thus to manufacture an interposer 4 with excellent reliability.

For example, one main surface of the copper foil 15*x* is preferably roughened by an etchant including an organic acid such as a formic acid as a major component to form unevenness. As a result, since the inorganic insulating layer 17 is formed along the unevenness, the bonding strength of the inorganic insulating layer 17 and the copper foil 15*x* can be enhanced by the anchor effect of the unevenness, and unevenness can be formed on the surface of the inorganic insulating layer 17. In addition, it is possible to enhance the bonding strength of the first inorganic insulating layer 17*a* and the first conductive layer 15*a* in the interposer 4.

The first inorganic insulating sol includes a solid content and a solvent. The first inorganic insulating sol includes the solid content in a range of 5 vol % or more and 50 vol % or less and includes the solvent in a range of 50 vol % or more and 95 vol % or less. As a result, since the solvent is included by 50 vol % or more of the first inorganic insulating sol, it is possible to reduce the viscosity of the first inorganic insulating sol and to improve the flatness of the upper surface of the inorganic insulating layer 17. Since the solvent is included by 95 vol % or less of the first inorganic insulating sol, it is possible to improve the productivity of the inorganic insulating layer 17 by increasing the solid content of the first inorganic insulating sol. It is preferable that the solid content include the first inorganic insulating particles 19*a* in a range of 10 vol % or more and less than 50 vol % and include the second inorganic insulating particles 19*b* in a range of 50 vol % or more and less than 90 vol %.

The first inorganic insulating particles 19*a* having a small particle diameter can be manufactured by refining a silicate compound such as a silicate compound such as sodium silicate solution (water glass) and chemically extracting silicon oxide through the use of a hydrolysis method or the like. By manufacturing the particles in this way, it is possible to suppress crystallization of the first inorganic insulating particles 19*a* and to maintain the amorphous state. When the first inorganic insulating particles are manufactured in this way, the first inorganic insulating particles 19*a* may include impurities of sodium oxide or the like in a range of 1 ppm or more and 5000 ppm or less.

The particle diameter of the first inorganic insulating particles 19*a* is preferably set to 3 nm or more. As a result, it is possible to reduce the viscosity of the first inorganic insulating sol and to improve the flatness of the upper surface of the inorganic insulating layer 17.

The second inorganic insulating particles 19*b* having a large particle diameter can be manufactured by refining a silicate compound such as sodium silicate solution (water glass), spraying a solution in which silicon oxide is chemically extracted into flames, and heating the resultant at a temperature of 800° C. or higher and 1500° C. or lower while suppressing the formation of aggregates. Here, since the second inorganic insulating particles 19*b* can be easily manufactured through high-temperature heating while reducing the formation of aggregates in comparison with the first inorganic insulating particles 19*a*, it is possible to easily raise the hardness of the second inorganic insulating particles 19*b* in comparison with the first inorganic insulating particles 19*a* by manufacturing the second inorganic insulating particles 19*b* through the high-temperature heating.

The heating time at the time of manufacturing the second inorganic insulating particles 19*b* is preferably set to a range of 1 second or longer and 180 seconds or shorter. As a result, by shortening the heating time, the crystallization of the second inorganic insulating particles 19*b* can be suppressed to maintain the amorphous state even when they are heated at a temperature of 800° C. or higher and 1500° C. or lower.

Examples of the solvent include organic solvents such as methanol, isopropanol, n-butanol, ethylene glycol, ethylene glycol monopropylether, methylethylketone, methylisobutyl ketone, xylene, propylene glycol monomethylether, propylene glycol monomethylether acetate, or dimehtylacetamide. Among these, a solvent including methanol, isopropanol, or propylene glycol monomethylether can be preferably used. As a result, it is possible to uniformly apply the first inorganic insulating sol and to efficiently vaporize the solvent.

The application of the first inorganic insulating sol can be performed, for example, using a dispenser, a bar coater, a die coater, or screen printing.

The first inorganic insulating sol applied to one main surface of the copper foil 15x is formed in a flat panel shape and the thickness after drying is set to, for example, a range of 3 μm or more and 110 μm or less.

The drying of the first inorganic insulating sol is performed, for example, through heating and air-drying. In this case, it is preferable that the temperature be set to 20° C. or higher and less than the boiling point (the boiling point of the solvent having the lowest boiling point when two or more solvents are mixed) of the solvent and the drying time be set to a range of 20 seconds or longer 30 minutes or shorter. As a result, by reducing the boiling of the solvent, it is possible to raise the filling density of the first inorganic insulating particles 19a and the second inorganic insulating particles 19b and thus to enhance the flatness of the inorganic insulating layer 17.

The heating temperature of the first inorganic insulating sol is preferably set to the boiling point of the solvent or higher and the crystallization start temperature or lower of the first inorganic insulating particles 19a and the second inorganic insulating particles 19b. As a result, since the heating temperature is equal to or higher than the boiling point of the solvent, it is possible to efficiently vaporize the remaining solvent. Since the heating temperature is lower than the crystallization start temperature of the first inorganic insulating particles 19a and the second inorganic insulating particles 19b, it is possible to reduce the crystallization of the first inorganic insulating particles 19a and the second inorganic insulating particles 19b to raise the ratio of the amorphous state. As a result, it is possible to reduce cracks generated due to a phase transition based on the crystallization in the inorganic insulating layer 17. Particularly, when silicon oxide is used as the inorganic insulating material of the first inorganic insulating particles 19a and the second inorganic insulating particles 19b, it is possible to effectively reduce the crystallization of the first inorganic insulating particles 19a. The crystallization start temperature is a temperature at which an amorphous inorganic insulating material starts its crystallization, that is, a temperature at which the volume of the crystalline phase region increases. For example, the crystallization start temperature of silicon oxide is about 1,300° C.

In heating the first inorganic insulating sol, it is preferable that the temperature be set to 100° C. or higher and lower than 600° C. and the time be set to, for example, a range of 0.5 hour or longer and 24 hours or shorter. The heating of the first inorganic insulating sol can be performed, for example, in the atmospheric air. When the temperature is raised to 150° C. or higher, the oxidation of the copper foil 15x is suppressed. Accordingly, the heating of the first inorganic insulating sol is preferably performed in vacuum or in an atmosphere of inert gas such as argon or nitrogen.

On the other hand, the particle diameter of the first inorganic insulating particles 19a before heating the first inorganic insulating sol is preferably set to 110 nm or less, particularly, to 50 nm or less. As a result, even when the heating temperature of the first inorganic insulating sol is a low temperature which is lower than the crystallization start temperature of the first inorganic insulating particles 19a and lower than the decomposition temperature of the first resin adhesive layer 12a, it is possible to strongly connect the first inorganic insulating particles 19a to each other. This is because the particle diameter of the first inorganic insulating particles 19a is set to 110 nm or less which is very small and the atoms of the first inorganic insulating particles 19a, particularly, the atoms of the surface thereof, actively move, whereby the first inorganic insulating particles 19a are strongly connected at such a low temperature.

By setting the particle diameter of the first inorganic insulating particles 19a to be smaller, it is possible to strongly connect the first inorganic insulating particles 19a to each other at lower temperatures. The temperature at which the first inorganic insulating particles 19a can be strongly connected is about 250° C. when the particle diameter is set to 110 nm or less, and about 150° C. when the particle diameter is set to 50 nm or less.

The solid content of the first inorganic insulating sol preferably includes the first inorganic insulating particles 19a by 5 vol % or more. As a result, by securing the amount of the first inorganic insulating particles 19a disposed in close points between the second inorganic insulating particles 19b and reducing the area in which the second inorganic insulating particles 19b are in contact with each other, it is possible to enhance the rigidity of the inorganic insulating layer 17.

In this way, the insulating sheet 20 shown in FIG. 3(a) can be manufactured.

(4) As shown in FIGS. 3(b) and 3(c), a stacked board 21 including the substrate 14 and the copper foil 15x disposed on both main surfaces of the substrate is manufactured. Specifically, the stacked board is manufactured, for example, as follows.

First, A first resin layer precursor sheet 18ax including an uncured thermosetting resin is prepared. Then, the insulating sheet 20 is stacked on the top and bottom of the first resin layer precursor sheet 18ax so that the inorganic insulating layers 17 (the first and second inorganic insulating layers 17a and 17b) are in contact with both main surfaces of the first resin layer precursor sheet 18ax. By vertically heating and pressing the stacked resultant, the thermosetting resin of the first resin layer precursor sheet 18ax is thermally cured to form the first resin layer 18a. As a result, the substrate 14 including the copper foil 15x disposed on both main surfaces can be formed.

Here, since the thermosetting resin of the first resin layer precursor sheet 18ax is thermally cured at the time of forming the first resin layer 18a, the first resin layer 18a and the first and second inorganic insulating layers 17a and 17b are heated and thermally expand. Accordingly, when the first resin layer 18a and the first and second inorganic insulating layers 17a and 17b are cooled, for example, at a room temperature, the coefficient of thermal expansion in the planar direction of the first resin layer 18a is higher than those of the first and second inorganic insulating layers 17a and 17b. Accordingly, since the first resin layer 18a contract more than the first and second inorganic insulating layers 17a and 17b, compressive stress in the planar direction remains in the first and second inorganic insulating layers 17a and 17b. Therefore, for example, when external stress or thermal stress is applied to the first and second inorganic insulating layers 17a and 17b, it is possible to reduce the cracks in the first and second inorganic insulating layers 17a and 17b due to the compressive stress remaining in the first and second inorganic insulating layers 17a and 17b.

In heating and pressing the stacked body, the temperature is preferably set to a curing start temperature of the first resin layer precursor sheet 18ax or higher and less than the decomposition temperature. Specifically, the temperature in heating and pressing of the stacked body is set to, for example, a range of 170° C. or higher and 230° C. or lower, the pressure is set to, for example, a range of 2 MPa or more and 10 MPa or less, and the time is set to, for example, a range of 0.5 hour or longer and 2 hours or shorter. The curing start temperature is a temperature at which a resin is changed to a C-stage state based on ISO 472:1999. The decomposition temperature is a temperature at which the mass of the resin decreases by 5% in thermogravimetry based on ISO 11358:1997.

Since the first resin layer precursor sheet 18ax is softened and flow at the time of heating and pressing the stacked body, it is possible to form a substrate 14 with excellent flatness by performing the heating and pressing, for example, using a flat metal plate.

In this way, the stacked board 21 shown in FIG. 3(c) can be manufactured.

Figure 4:
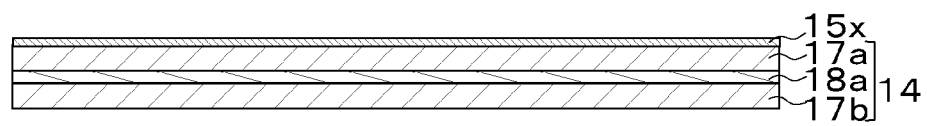
FIG. 4 is a cross-sectional view taken along the thickness direction, which illustrates processes of manufacturing the electronic device shown in FIG. 1.
Figure 4:
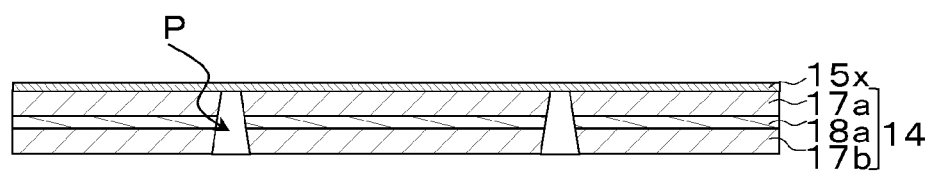
Figure 4:
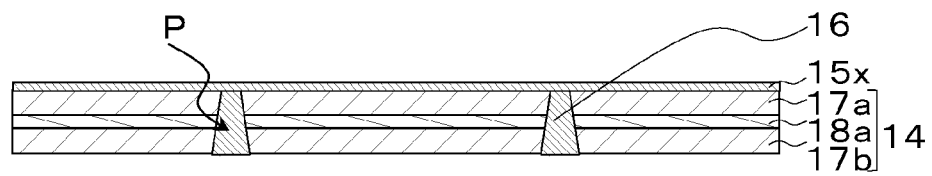
Figure 4:
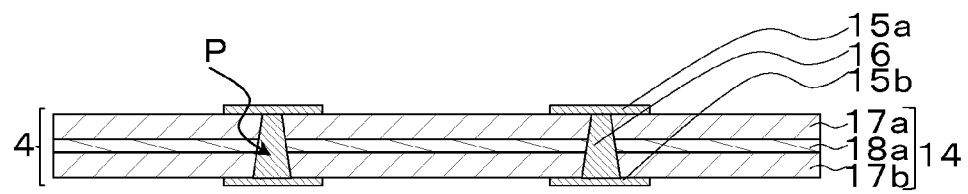

(5) As shown in FIG. 4, the penetrating conductor 16 penetrating the substrate in the thickness direction thereof is formed in the substrate 14 and the first conductive layer 15a and the second conductive layer 15b are formed on both main surfaces of the substrate 14, whereby the interposer 4 is manufactured. Specifically, the interposer is manufactured, for example, as follows.

First, as shown in FIG. 4(a), the copper foil 15x disposed on the main surface of the substrate 14 on the second inorganic insulating layer 17b side is peeled off from the substrate 14 of the stacked board 21 using an etchant such as ferric chloride or cupric chloride. Then, as shown in FIG. 4(b), by irradiating the peeled-off main surface with a laser beam of a carbon dioxide gas laser, a YAG laser, or the like, a penetrating-hole P penetrating the substrate 14 in the thickness direction thereof is formed and a part of the copper foil 15x disposed on the main surface of the substrate 14 on the second inorganic insulating layer 17b side is exposed to the inside of the penetrating-hole P. As shown in FIG. 4(c), a conductive material is attached to the exposed surface of the copper foil 15x using electrical plating and the penetrating-hole P is filled with the conductive material, whereby the penetrating conductor 16 is formed. As shown in FIG. 4(d), a conductive material is attached to the main surface from which the copper foil 15x is peeled off using electroless plating, electrical plating, sputtering, vapor deposition, or the like, and a photolithographic process and an etching process are performed to form the first conductive layer 15a and the second conductive layer 15b.

In this way, the interposer 4 shown in FIG. 4(d) can be manufactured.

Manufacturing of Electronic Device 1

(6) By mounting the interposer 4 on the circuit board 3 via the second bumps 5b and mounting the electronic component 2 on the interposer 4 via the first bumps 5a, it is possible to manufacture the electronic device 1 shown in FIG. 1(a).

The first embodiment states the configuration in which a resin build-up board is used as the circuit board, but the circuit board may be, for example, a ceramic board or a composite board of resin and ceramic or may be, for example, a resin coreless board or a single-layered printed board.

Further, the first embodiment states the configuration in which the insulating layer of the build-up portion of the circuit board is a single layer, but the number of insulating layers of the build-up portion is not particularly limited.

Further, the first embodiment states the configuration in which the inorganic insulating layer of the interposer is formed of an inorganic insulating material containing silicon oxide as a major component, but other inorganic insulating materials may be used and ceramic materials such as aluminum oxide or silicon of which the surface is oxidized may be used.

Further, the first embodiment states the configuration in which the penetrating conductor of the interposer is filled in the penetrating-hole, but the penetrating conductor has only to be disposed in the penetrating-hole and the penetrating conductor may be attached to the inner wall of the penetrating-hole in a cylindrical shape.

Further, the first embodiment states the manufacturing method when the first resin layer of the interposer is formed of a thermosetting resin, but the first resin layer may be formed of, for example, a thermoplastic resin.

Further, the first embodiment states the manufacturing method in which the conductive material is attached to the copper foil exposed into the penetrating-hole using electrical plating to fill the penetrating-hole with the conductive material in the process of (5), but a conductive material may be attached to the inner wall of the penetrating-hole using, for example, electroless plating, sputtering, or vapor deposition to form an underlying layer and then a conductive material may be attached to the underlying layer using electrical plating to fill the penetrating-hole with the conductive material.

Further, the first embodiment states the manufacturing method in which the copper foil is peeled off from the substrate of the stacked board in the process of (5), but the copper foil may be etched to form the conductive layer without peeling off the copper foil from the substrate of the stacked board.

Second Embodiment

Figure 5:
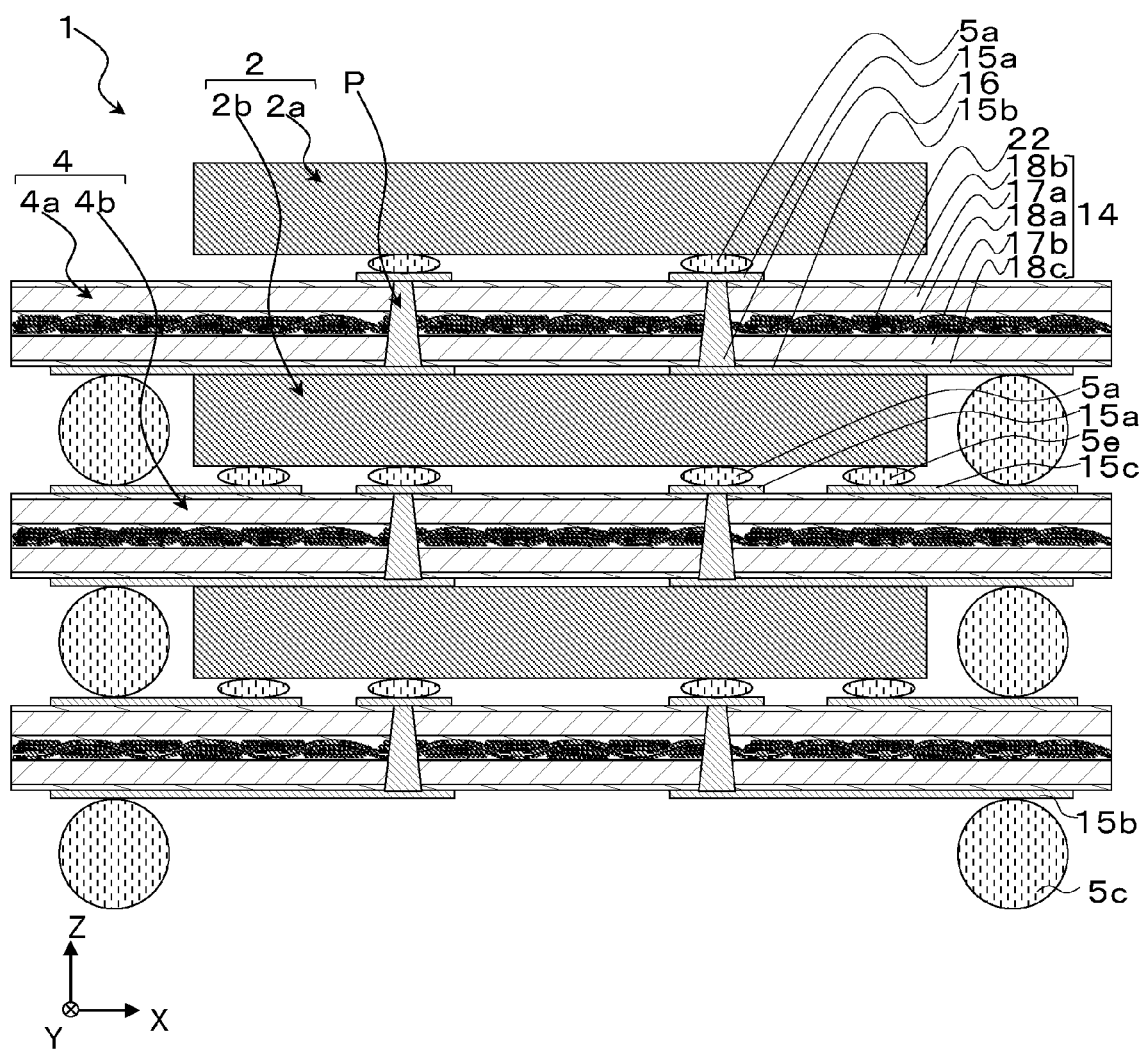
FIG. 5 is a cross-sectional view of an electronic device according to a second embodiment of the invention taken along a thickness direction thereof.

Next, an electronic device including an interposer according to a second embodiment of the invention will be described below in detail with reference to FIG. 5. As to the same constitutions as in the first embodiment, description thereof will be omitted.

The second embodiment is different from the first embodiment, in that the interposer 4 is not interposed between the circuit board and the electronic component but is interposed between electronic components 2 separated from each other in the thickness direction and the electronic components 2 and the interposer 4 are alternately stacked in the thickness direction to constitute an electronic device 1. Accordingly, since the electronic components 2 can be three-dimensionally mounted, it is possible to reduce the size of the electronic device 1 and to enhance the signal transmission characteristics.

The electronic device 1 is electrically connected to an external circuit such as a mother board via the third bumps 5c connected to the lower surface of the second conductive layer 15b of the interposer 4 located in the lowermost layer.

In the electronic device 1, the electronic components 2 and the interposers 4 alternately stacked in the thickness direction are electrically connected to each other as follows.

For the purpose of convenience, out of the interposers 4 adjacent to each other in the thickness direction, the interposer located upper is defined as a first interposer 4a and the interposer located lower is defined as a second interposer 4b. Out of the electronic components 2, the electronic component mounted on the first interposer 4a is defined as a first electronic component 2a and the electronic component mounted on the second interposer 4b is defined as a second electronic component 2b.

First, in the first interposer 4a, like the first embodiment, the first conductive layer 15a connected to the upper end of the penetrating conductor 16 is electrically connected to the first electronic component 2a via the first bump 5a. On the other hand, in the first interposer 4a, unlike the first embodiment, the second conductive layer 15b connected to the lower end of the penetrating conductor 16 is drawn out to the outside of the mounting area of the first electronic component 2a from the area just below the penetrating conductor 16 and is electrically connected to the third conductive layer 15c of the second interposer 4b with the fourth bump 5d in the outside of the mounting area of the first electronic component 2a. In the second interposer 4b, the third conductive layer 15c is drawn out to the inside of the mounting area of the second electronic component 2b from the outside of the mounting area of the second electronic component 2b and is electrically connected to the second electronic component 2b via the fifth bump 5e in the inside of the mounting area of the second electronic component 2b. In the second interposer 4b, the first conductive layer 15a connected to the upper end of the penetrating conductor 16 is electrically connected to the second electronic component 2b via the first bump 5a connected to the upper surface thereof.

In this way, the electronic components 2 and the interposers 4 alternately stacked in the thickness direction are electrically connected to each other.

In the electronic device 1, since the second conductive layer 15b is drawn out from the area just below the penetrating conductor 16 to the outside of the mounting area of the first electronic component 2a, tensile strength can be easily applied to the second conductive layer 15b due to the protruding of the penetrating conductor 16 with an application of heat to the electronic device 1. However, in the interposers 4 according to this embodiment, like the first embodiment, since the coefficient of thermal expansion in the thickness direction of the substrate 14 is larger than the coefficient of thermal expansion in the planar direction, the protruding of the penetrating conductor 16 is suppressed and it is thus to reduce the tensile stress on the second conductive layer 15b and to reduce the disconnection of the second conductive layer 15b.

The fourth bump 5d and the fifth bump 5e can be formed of the same conductive material as the other bumps and the third conductive layer 15c can be formed of the same conductive material as the other conductive layers.

On the other hand, in the second embodiment, unlike the first embodiment, the electronic components 2 are preferably memory-type semiconductor devices. Since the memory-type semiconductor devices have the smaller number of pads and have a more alleviated decrease in size of a circuit in comparison with the logic-type semiconductor devices, it is possible to three-dimensionally mount the electronic components 2 while maintaining the electrical connection reliability.

On the other hand, in the second embodiment, unlike the first embodiment, the substrate 14 of the interposer 4 further includes a second resin layer 18b located in the outermost layer and being in contact with the first inorganic insulating layer 17a and a third resin layer 18c located in the outermost layer and being in contact with the second inorganic insulating layer 17b. Accordingly, by interposing the second resin layer 18b between the first inorganic insulating layer 17a and the first conductive layer 15a, it is possible to raise the bonding strength between the first inorganic insulating layer 17a and the first conductive layer 15a and to reduce the peeling of the first inorganic insulating layer 17a and the first conductive layer 15a to reduce the disconnection of the first conductive layer 15a, thereby reducing the size of the first conductive layer 15a while maintaining the electrical reliability of the first conductive layer.

The thickness and Young's modulus of the second resin layer 18b are preferably set to be smaller than those of the first resin layer 18a. As a result, since the second resin layer 18b having a small thickness and small Young's modulus is interposed between the first inorganic insulating layer 17a and the first conductive layer 15a, the first resin layer 18a being thin and being easily elastically deformable is deformed to alleviate the stress due to the difference in coefficient of thermal expansion between the first inorganic insulating layer 17a and the first conductive layer 15a. Therefore, it is possible to reduce the peeling of the first inorganic insulating layer 17a and the first conductive layer 15a. By reducing the thickness of the second resin layer 18a, it is possible to reduce the contribution of the second resin layer 18a to the coefficient of thermal expansion in the planar direction on the main surface of the substrate 14 and to reduce the coefficient of thermal expansion in the planar direction on the main surface of the substrate 14. The thickness and Young's modulus of the second resin layer 18b are preferably set to be smaller than those of the first inorganic insulating layer 17a and the first conductive layer 15a.

The second resin layer 18b includes a resin material and an inorganic insulating filler, the thickness thereof is set to, for example, a range of 0.5 μm or more and 3 μm or less, the thickness is set to, for example, a range of 0.01 time or more and less than 0.1 time that of the first resin layer 18a, the thickness is set to, for example, a range of 0.01 time or more and 0.3 time or less that of the first inorganic insulating layer 17a, the coefficients of thermal expansion in the thickness direction and the planar direction are set to a range of 20 ppm/° C. or more and 100 ppm/° C. or less, the Young's modulus is set to, for example, a range of 0.05 GPa or more and 5 GPa or less, the Young's modulus is set to, for example, a range of 0.01 time or more and 0.7 time or less that of the first resin layer 18a, the Young's modulus is set to, for example, a range of 0.005 time or more and 0.5 time or less that of the first inorganic insulating layer 17a, the Young's modulus is set to, for example, a range of 0.0005 time or more and 0.03 time or less that of the first conductive layer 15a, and the dielectric tangent is set to, for example, a range of 0.001 or more and 0.02 or less.

The resin material included in the second resin layer 18b serves as a main part of the second resin layer 18b and examples thereof include an epoxy resin, a bismaleimidetriazine resin, a cyanate resin, and a polyimide resin. The Young's modulus of the resin material is set to, for example, a range of 0.05 GPa or more and 5 PGa or less and the coefficients of thermal expansion in the planar direction and the thickness direction are set to, for example, a range of 20 ppm/° C. or more and 100 ppm/° C. or less.

The inorganic insulating filler included in the second resin layer 18b has a function of raising flame retardance of the second resin layer 18b and includes an inorganic insulating material such as silicon oxide. In the inorganic insulating filler included in the second resin layer 18b, the particle diameter is set to, for example, a range of 0.01 μm or more and 0.5 μm or less, the particle diameter is set to a range of 0.01 time or more and 0.3 time or less that of the inorganic insulating filler included in the first resin layer 18a, the content in the resin material is set to, for example, a range of 0 vol % or more and 10 vol % or less, and the content in the resin material is set to a range of 0.001 time or more and 0.1 time or less that of the inorganic insulating filler included in the first resin layer 18a.

The substrate 14 including the second resin layer 18b can be formed as follows.

Figure 6:
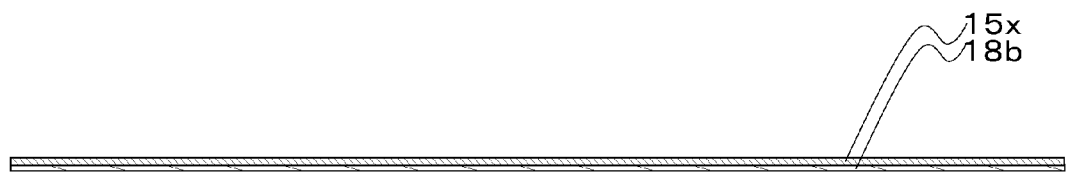
FIG. 6 is a cross-sectional view taken along the thickness direction, which illustrates a process of forming a second resin layer included in an interposer in processes of manufacturing the electronic device shown in FIG. 5.
Figure 6:
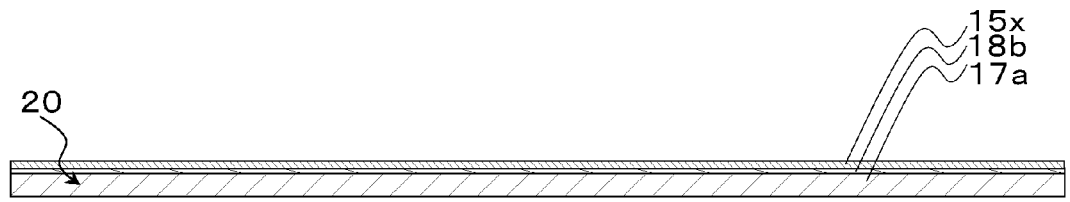
Figure 6:
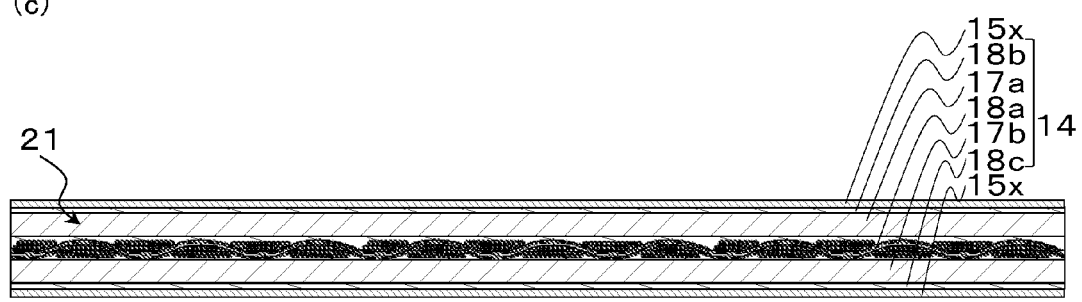

First, as shown in FIG. 6(a), a copper foil 15x in which the second resin layer 18b is in contact with the main surface thereof is prepared and an inorganic insulating layer 17 is formed on the second resin layer 18b, whereby an insulating sheet 20 is manufactured. Then, as shown in FIGS. 6(b) and 6(c), the insulating sheets 20 are stacked on the top and the bottom of the first resin layer precursor sheet 18ax so that the inorganic insulating layers 17 are in contact with both main surfaces of the first resin layer precursor sheet 18ax, and the stacked body is vertically heated and pressed, whereby the substrate 14 including the second resin layer 18b can be formed.

Here, the copper foil 15x in which the second resin layer 18b is in contact with the main surface thereof can be formed by coating the copper foil 15x with resin varnish using a bar coater, a die coater, a curtain coater, or the like and drying the resultant. In this way, since the second resin layer 18b is formed on the copper foil 15x, the second resin layer 18b can be made to be small and uniform in thickness. The second resin layer 18b formed in this process is, for example, a B-stage or a C-stage and becomes a desired cured state through heating.

The formation of the inorganic insulating layer 17 on the second resin layer 18b can be performed in the same way as the process of (3) in the first embodiment. As a result, since the inorganic insulating layer 17 is formed by coupling the first inorganic insulating particles having a small diameter, the heating temperature for forming the inorganic insulating layer 17 can be set to a low temperature lower than the decomposition temperature of the second resin layer 18b, thereby suppressing the damage of the second resin layer 18b. In this case, the heating temperature for forming the inorganic insulating layer 17 is set to, for example, a range of 80° C. or higher and 250° C. or lower. The decomposition temperature of the second resin layer 18b is set to, for example, 270° C. or higher.

The third resin layer 18c has the same configuration and operational advantages as the second resin layer 18b and is formed through the same method as the second resin layer 18b.

On the other hand, in the interposer 4 according to the second embodiment, unlike the first embodiment, the first resin layer 18a includes a base material 22 formed of fibers coated with a resin material. As a result, it is possible to enhance the rigidity of the substrate 14 which is interposed between the electronic components 2 separated in the thickness direction and to which stress can be easily applied, and thus to enhance the reliability of the electronic device 1.

In the base material 22, the coefficient of thermal expansion in the planar direction is preferably set to be smaller than the coefficient of thermal expansion in the thickness direction. As a result, the coefficient of thermal expansion in the planar direction on both main surfaces of the base material 14 can be set to be further smaller than the coefficient of thermal expansion in the thickness direction in the inner wall of the penetrating-hole P.

For example, a woven fabric in which fibers are vertically and horizontally woven can be used as the base material 22 and examples of the fibers include glass fiber, resin fiber, carbon fiber, and metal fiber. Among these, glass fiber including amorphous silicon oxide can be preferably used. In the base material 22, the thickness is set to, for example, 0.01 mm or more and less than 0.1 mm, the coefficient of thermal expansion in the planar direction is set to, for example, a range of 8 ppm/° C. or more and 20 ppm/° C. or less, the coefficient of thermal expansion in the thickness direction is set to, for example, a range of 12 ppm/° C. or more and 25 ppm/° C. or less, and the Young's modulus is set to, for example, a range of 5 GPa or more and 35 GPa or less.

The thickness of the first resin layer 18a including the base material 22 is preferably set to be smaller than the total thickness of the first inorganic insulating layer 17a and the second inorganic insulating layer 17b. From this viewpoint of thickness, the first resin layer 18a preferably includes only one layer of the base material 22.

The thickness of the first resin layer 18a including the base material 22 is set to, for example, 0.01 mm or more and less than 0.1 mm and the thickness is set to, for example, a range of 0.1 time or more and less than 1 time that of the first inorganic insulating layer 17a.

The second embodiment states the configuration in which a woven fabric is used as the base material, but a non-woven fabric may be used as the base material or a material in which fibers are arranged in one direction may be used.

Third Embodiment

Figure 7:
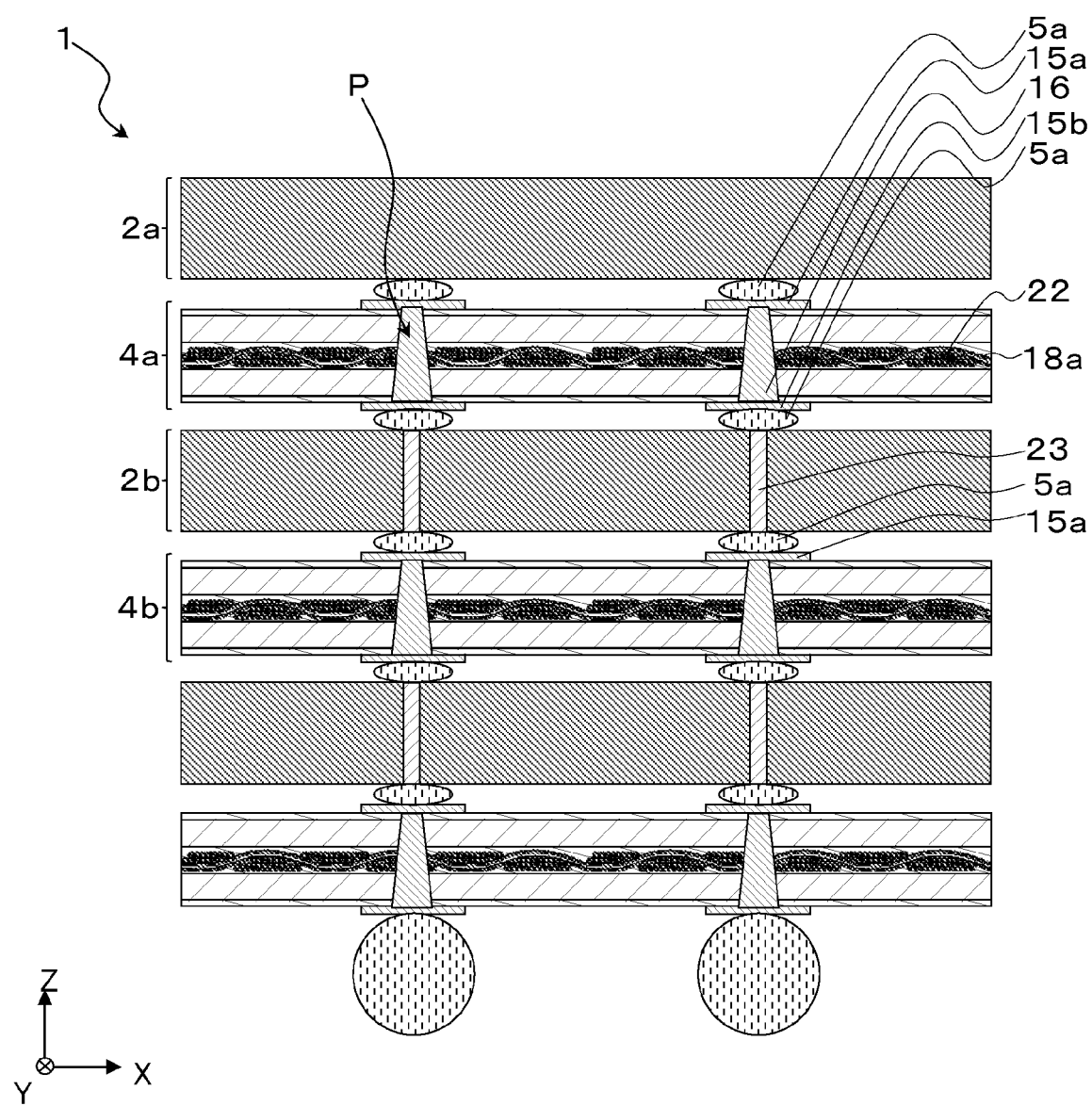
FIG. 7 is a cross-sectional view of an electronic device according to a third embodiment of the invention taken along a thickness direction thereof.

Next, an electronic device including an interposer according to a third embodiment of the invention will be described below in detail with reference to FIG. 7. As to the same constitutions as in the first and second embodiments, description thereof will be omitted.

The third embodiment is similar to the second embodiment in that the electronic device 1 is constructed by alternately stacking the electronic components 2 and the interposers 4 in the thickness direction, but is different from the second embodiment in the electrical connections between the electronic components 2 and the interposers 4 alternately stacked.

The electrical connections between the electronic components 2 and the interposers 4 alternately stacked will be specifically described below.

In the first interposer 4a, like the second embodiment, the first conductive layer 15a connected to the upper end of the penetrating conductor 16 is electrically connected to the first electronic component 2a via the first bump 5a. Here, in the electronic device 1 according to this embodiment, unlike the second embodiment, the electronic component 2 includes a conductive penetrating electrode 23 passing in the thickness direction. Accordingly, in the first interposer 4a, the second conductive layer 15b connected to the lower end of the penetrating conductor 16 is electrically connected to the upper end of the penetrating electrode 23 of the second electronic component 2b via the first bump 5a. In the second interposer 4b, the first conductive layer 15a connected to the upper end of the penetrating conductor 16 is electrically connected to the lower end of the penetrating electrode 23 of the second electronic component 2b via the first bump 5a.

Since the electronic components 2 and the interposers 4 alternately stacked are electrically connected to each other in this way, the second conductive layer 15b of the interposers 4 does not have to be drawn out from the inside of the mounting area of the electronic component 2 to the outside of the mounting area of the electronic component 2 and the size and the wiring length of the interposers 4 can be reduced, thereby enhancing the signal transmission characteristics.

The penetrating electrode 23 is formed by filling the penetrating-hole penetrating the electronic component 2 in the thickness direction with a conductive material, and as the conductive material, for example, copper, silver, gold, aluminum, nickel, or the like are usable.

Fourth Embodiment

Next, an electronic device including an interposer according to a fourth embodiment of the invention will be described below in detail with reference to FIGS. 8 and 9. As the same constitutions as in the first, second, and third embodiments, description thereof will be omitted.

Figure 8:
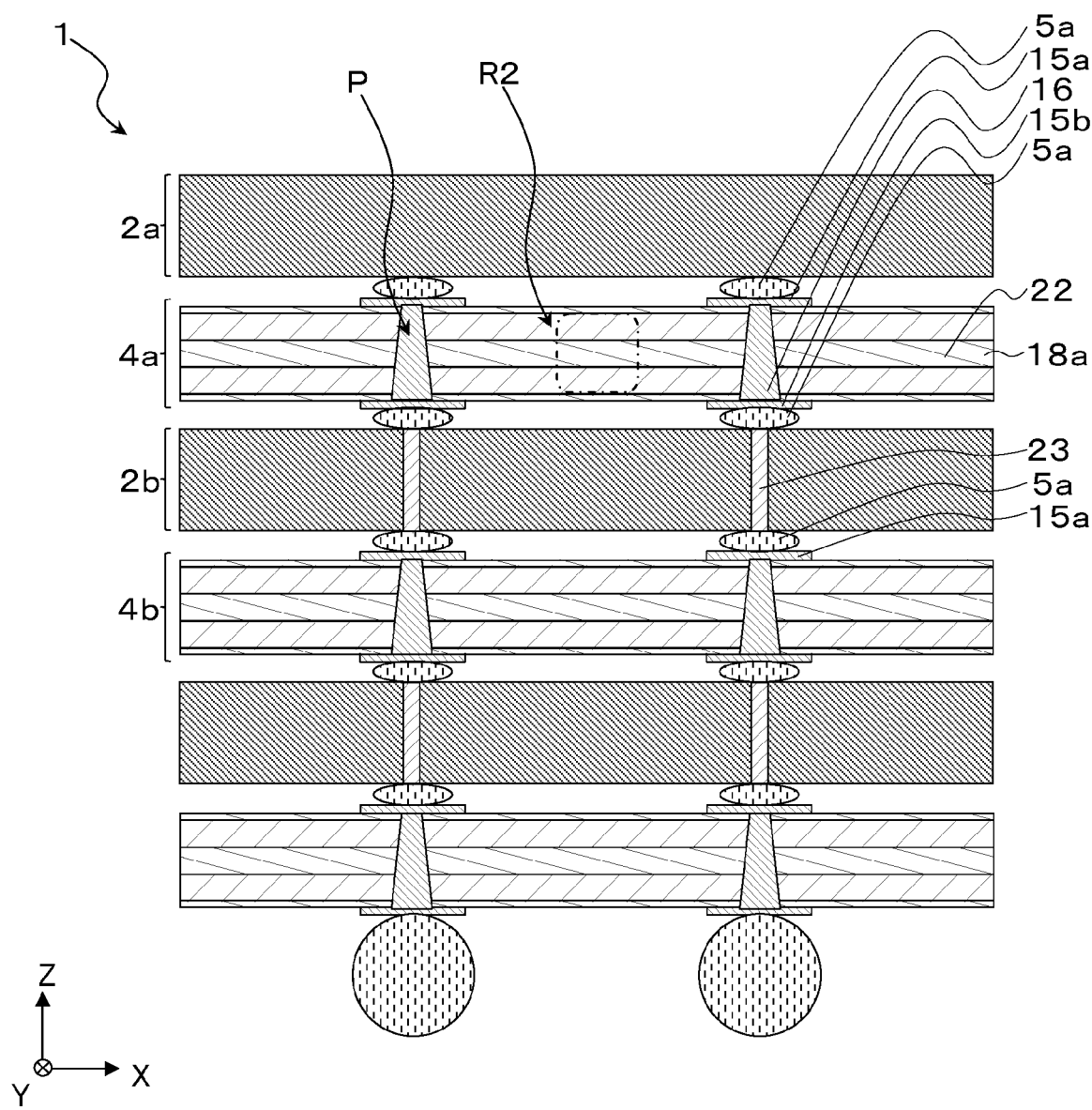
FIG. 8 is a cross-sectional view of an electronic device according to a fourth embodiment of the invention taken along a thickness direction thereof.
Figure 9:
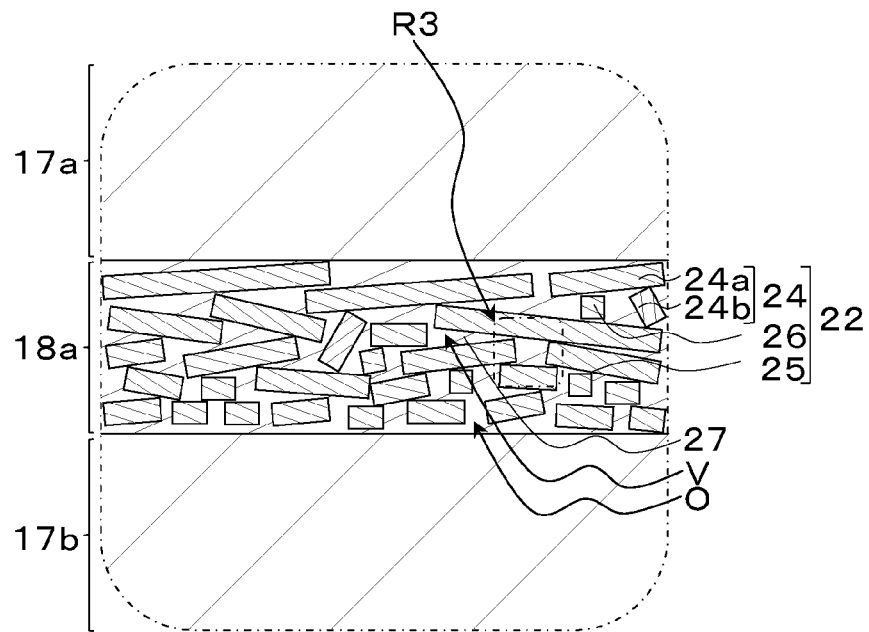
FIG. 9(a) is an enlarged view of a section R2 in FIG. 8
FIG. 9(b) is an enlarged view of a section R3 in FIG. 9(a).
Figure 9:
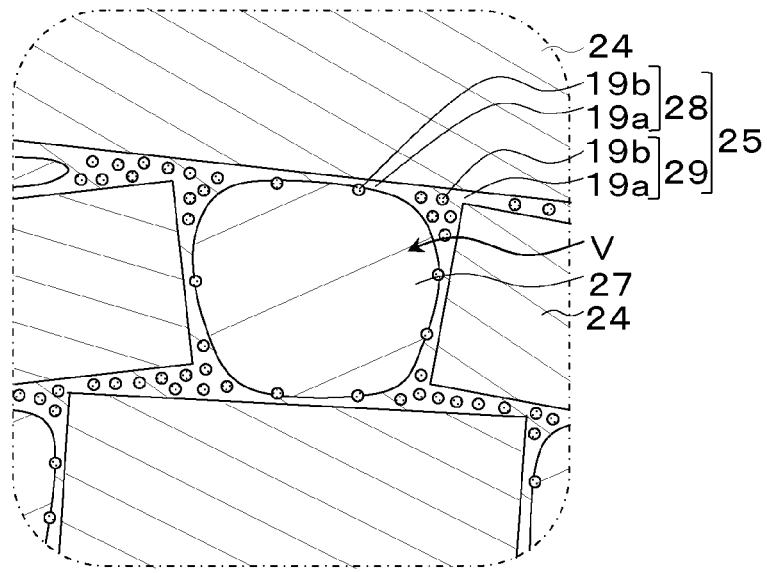

The fourth embodiment has the same mounting structure as the third embodiment, as shown in FIG. 8, but the base material 22 includes a plurality of fibers 24, inorganic insulating members 25 connected to each of neighboring fibers 24 at an approaching position between the neighboring fibers 24, a plurality of fractured particles 26 connected to the fibers 24 via the inorganic insulating members 25, and a plurality of voids V surrounded with the fibers 24 and the inorganic insulating members 25, unlike the third embodiment, as shown in FIGS. 9(a) and 9(b). The thickness of the base material 22 is set to, for example, a range of 5 μm or more and 100 μm or less. The thickness of the base material 22 is set to, for example, a range of 10% or more and 50% or less of that of the first resin layer 18a.

Fine short fibers (pulverized fibers) obtained by pulverizing long glass fibers of E glass, S glass, T glass, or the like can be used as the fibers 24, which are formed of an inorganic insulating material including amorphous silicon oxide, for example, by 40 wt % or more and 65 wt % or less. The inorganic insulating material may include inorganic insulating materials such as aluminum oxide, titanium oxide, magnesium oxide, and zirconium oxide in addition to silicon oxide.

The width of the fibers 24 is set to, for example, a range of 4 μm or more and 10 μm or less and the length is set to, for example, a range of 8 μm or more and 500 μm or less. The length of the fibers 24 is set to, for example, a range of 2 times or more and 50 times or less the width thereof. In the fibers 24, the coefficient of thermal expansion in the respective directions is set to, for example, a range of 2 ppm/° C. or more and 6 ppm/° C. or less and the Young's modulus is set to, for example, a range of 65 GPa or more and 85 GPa or less.

In the fibers 24, an approaching position at which an end portion (a corner portion between a side surface and an end surface) of one fiber 24 gets close to a side surface of the other fiber 24 is formed between the neighboring fibers 24.

The inorganic insulating members 25 are formed of the same material as the first and second inorganic insulating layers 17a and 17b and have the same elastic modulus, hardness, and coefficient of thermal expansion as the first and second inorganic insulating layers 17a and 17b. The inorganic insulating members 25 include a plurality of third inorganic insulating particles 19c and a plurality of fourth inorganic insulating particles 19d having a particle diameter larger than that of the third inorganic insulating particles 19c. The third inorganic insulating particles 19c are formed of the same material as the first inorganic insulating particles 19a and have the same content, particle diameter, elastic modulus, hardness, and operational advantages as the first inorganic insulating particles 19a. The fourth inorganic insulating particles 19d are formed of the same material as the second inorganic insulating particles 19b and have the same content, particle diameter, elastic modulus, hardness, and operational advantages as the second inorganic insulating particles 19b.

The fractured particles 26 are connected to the fibers 24 via the inorganic insulating members 25 and are located in the voids V. Accordingly, by arranging the fractured particles 14 having higher rigidity than that of the inorganic insulating members 25 between the fibers 24, it is possible to raise the rigidity of the base material 22. Fine amorphous particles (powder) obtained by pulverizing long glass fibers of E glass, S glass, T glass, or the like can be used as the fractured particles 26.

The width of the fractured particles 26 is set to, for example, a range of 1 μm or more and 4 μm or less and the length thereof is set to, for example, a range of 1 μm or more and 4 μm or less. In the fractured particles 26, the length is set to, for example, a range of 1 time or more and 1.5 times or less the width. The fractured particles 26 are formed of the same material as the fibers 24 and have the same Young's modulus and coefficient of thermal expansion as the fibers 24.

The voids V are surrounded with the fibers 24 and the inorganic insulating members 25 in a cross-section taken along the thickness direction of the base material 22 and are filled with a part of the first resin layer 18a (a filling portion 27). In the voids V, the height in the thickness direction of the base material 22 in the cross-section is set to, for example, a range of 0.3 μm or more and 10 μm or less and the width in the planar direction of the base material 22 in the cross-section is set to, for example, a range of 0.3 μm or more and 50 μm or less. In the voids V, the content in the base material 22 is set to, for example, a range of 5 vol % or more and 40 vol % or less. The content of the voids V is measured through the same method as measuring the contents of the first inorganic insulating particles 19a to the fourth inorganic insulating particles 19d.

As described above, the voids V are surrounded with the fibers 24 and the inorganic insulating members 25 in the cross-section taken along the thickness direction, but since some thereof extends along a direction (Y direction) perpendicular to the cross-section and some thereof extend in the thickness direction (Z direction) of the base material 22 in a three-dimensional shape, the voids are connected to openings O formed in one main surface of the base material 22 in contact with the first resin layer 18a to form open voids. Accordingly, a part of the first resin layer 18a is filled in the voids V through the openings O. The filling portion 27 does not have to be completely filled in the corresponding void V and a part of the first resin layer 18a has only to be disposed in the void V.

The base material 22 in the fourth embodiment will be described below in detail.

In this embodiment, as shown in FIGS. 9(a) and (b), the base material 22 includes a plurality of fibers 24 and inorganic insulating members 25 connected to each of neighboring fibers 24 at an approaching position between the neighboring fibers 24. As a result, since the fibers 24 are connected to each other via the inorganic insulating members 25, the base material 22 can be formed flat, compared with glass fiber cloth in which unevenness can be easily formed due to glass fibers included therein. Accordingly, it is possible to further uniformly disperse the stress applied to the first and second conductive layers 15a and 15b to reduce the disconnection of the first and second conductive layers 15a and 15b, thereby obtaining an interposer 4 with excellent electrical reliability.

In this way, by reducing the disconnection of the first and second conductive layers 15a and 15b, it is possible to reduce the size of the conductive layers while guaranteeing the electrical reliability of the first and second conductive layers 15a and 15b.

When the base material 22 is reduced in thickness by connecting the fibers 24 with the inorganic insulating members 25, the misalignment of the fibers 24 can be reduced to suppress cracks, compared with the glass fiber cloth in which fibers can be easily misaligned. Accordingly, it is possible to reduce the thickness of the base material 22 while guaranteeing the electrical reliability.

The fibers 24 are connected by the inorganic insulating members 25 to form a body. Accordingly, compared with the case where a plurality of fibers not connected to each other are included in a resin material, when stress or heat is applied thereto, the inorganic insulating members 25 having higher rigidity and a lower coefficient of thermal expansion than the resin material connect the individual fibers 24 to reduce the deformation or thermal expansion of the base material 22, thereby obtaining the base material 22 having high rigidity and a low coefficient of thermal expansion.

On the other hand, in this embodiment, the fibers 24 are higher in rigidity and lower in thermal expansion than the inorganic insulating members 25. As a result, compared with the inorganic insulating members 25 as connection members, the base material 22 can be made to be high in rigidity and low in thermal expansion by the use of the fibers 24 which is easy to be higher in rigidity and lower in thermal expansion.

Since the fibers 24 are formed fine as described above, the base material 22 can be made to further flat.

In the base material 22 of this embodiment, the number of first fibers 24a in the plurality of fibers 24 is preferably larger than the number of second fibers 24b. As a result, when cracks generated on the surface of the first resin layer 18a grow along the thickness direction and reaches the base material 22, it is possible to reduce the growth of the cracks with the high-rigidity fibers 24 and to reduce the disconnection of the first and second conductive layers 15a and 15b due to the crack, by causing the length direction of the fibers 24 to approach the surface direction of the base material 22. The fibers 24 preferably include only the first fibers 24a.

On the other hand, in this embodiment, each of the inorganic insulating members 25 includes a coating portion 28 with which the surface of the fiber 24 is coated and a connecting portion 29 connecting each of the neighboring fibers 24 at the approaching position. As a result, since the coating portion 28 including the third inorganic insulating particles 19c, which is formed at a low temperature as described above, having higher reactivity with the resin material than the fibers 24 is disposed between the fibers 24 and the filling portion 27, it is possible to enhance the connecting strength between the fibers 24 and the filling portion 27 and to connect the fibers 24 to each other with the connecting portion 29.

The coating portion 28 is formed in a membrane shape and the thickness thereof is set to, for example, a range of 20 nm or more and 2 μm or less. The surface of the connecting portion 29 on the void V side has a concave curve shape which is concave inside the connecting portion 29 on the void V side in the cross-section taken along the thickness direction of the circuit board 3. The distance between the fibers 24 connected to each other with the connecting portion 29 is set to, for example, a range of 20 nm or more and 2 μm or less.

On the other hand, in the circuit board 3 according to this embodiment, the inorganic insulating members 25 include fourth inorganic insulating particles 19d having a particle diameter larger than that of the third inorganic insulating particles 19c. Accordingly, similarly to the second inorganic insulating particles 19b in the first and second inorganic insulating layers 17a and 17b, it is possible to reduce cracks in the inorganic insulating members 25. The inorganic insulating members 25 include third inorganic insulating particles 19c having a small diameter in addition to the fourth inorganic insulating particles 19d having a large diameter, and the fourth inorganic insulating particles 19d are connected to each other via the plural third inorganic insulating particles 19c disposed around the fourth inorganic insulating particles 19d. Accordingly, similarly to the first inorganic insulating particles 19a with respect to the second inorganic insulating particles 19b, it is possible to reduce the peeling of the fourth inorganic insulating particles 19d from each other through the use of the third inorganic insulating particles 19c.

On the other hand, in the inorganic insulating members 25, the connecting portion 29 includes more fourth inorganic insulating particles 19d than the coating portion 28 does. As a result, by decreasing the fourth inorganic insulating particles 19d in the coating portion 28 and increasing the third inorganic insulating particles 19c in the coating portion 28, it is possible to enhance the connecting strength between the coating portion 28 and the filling portion 27. By increasing the fourth inorganic insulating particles 19d in the connecting portion 29, it is possible to reduce cracks in the connecting portion 29 and to enhance the connecting strength between the fibers 24 through the use of the connecting portion 29.

As in this embodiment, the fourth inorganic insulating particles 19d in the coating portion 28 are connected to the fibers 24 via the third inorganic insulating particles 19c and protrude toward the filling portion 27. As a result, by the anchor effect of the fourth inorganic insulating particles 19d having a large particle diameter, it is possible to enhance the connecting strength between the coating portion 28 and the filling portion 27 and thus to reduce the peeling. The protruding length of the fourth inorganic insulating particles 19d is set to, for example, a range of 0.2 μm or more and 1.5 μm or less.

On the other hand, in this embodiment, the filling portions 27 are disposed in the voids V surrounded with the fibers 24 and the inorganic insulating members 25 in the cross-section of the base material 22 taken along the thickness direction. As a result, even when stress is applied to the circuit board 3 and cracks are generated in the base material 22, the growth of the cracks can be prevented or bypassed by the filling portion 27. Therefore, it is possible to reduce the disconnection of the first and second conductive layers 15a and 15b due to the cracks and thus to obtain a circuit board 3 with excellent electrical reliability.

The filling portion 27 includes the resin material, which has a Young's modulus lower than that of the inorganic insulating material, more than the base material 22 does. When stress is applied to the circuit board 3, the stress to be applied to the base material 22 can be alleviated by the filling portions 27 disposed in the voids of the base material 22 and the generation of cracks in the base material 22 due to the stress can be reduced.

The base material 22 in the fourth embodiment can be formed as follows.

(1') A second inorganic insulating sol including a solid content, which includes a fiber component (the fibers 24 and the fractured particles 26) and an inorganic insulating particle component (the third and fourth inorganic insulating particles 19c and 19d), and a solvent is prepared.

The second inorganic insulating sol includes the solid content, for example, in the range of 10 vol % or more and 50 vol % or less and includes the solvent in the range of 50 vol % or more and 90 vol % or less. Accordingly, it is possible to maintain high productivity of the base material 22 formed of the second inorganic insulating sol while maintaining low viscosity of the second inorganic insulating sol.

The solid content of the second inorganic insulating sol includes the fiber component, for example, in a range of 15 vol % or more and 60 vol % or less and includes the inorganic insulating particle component in a range of 40 vol % or more and 85 vol % or less. Accordingly, it is possible to reduce the cracks in the base material 22.

The fiber component of the second inorganic insulating sol includes the fibers 24, for example, in a range of 20 vol % or more and 90 vol % or less and includes the fractured particles 26 in a range of 10 vol % or more and 80 vol % or less. Accordingly, it is possible to enhance the hardness and the elastic modulus of the base material 22.

The inorganic insulating particle component of the second inorganic insulating sol includes the third inorganic insulating particles 19c, for example, in a range of 20 vol % or more and 90 vol % or less and includes the fourth inorganic insulating particles 19d in a range of 10 vol % or more and 80 vol % or less. Accordingly, it is possible to effectively reduce the generation of cracks in the base material 22 in the process of (3') to be described later.

Here, the fiber component can be formed by pulverizing long glass fibers, which is formed, for example, by causing molten glass to flow and extend from a platinum molding hole, through the use of a hammer mill or a ball mill. Accordingly, it is possible to obtain fibers 24 having high hardness and elastic modulus. By adjusting the pulverizing time, or pulverizing long glass fibers and classifying the pulverized glass fibers by the use of air, it is possible to adjust the ratios of the fibers 24 and the fractured particles 26 in the fiber component.

The third inorganic insulating particles 19c can be formed in the same way as the first inorganic insulating particles 19a and the fourth inorganic insulating particles 19d can be formed in the same way as the second inorganic insulating particles 19b. For the solvent of the second inorganic insulating sol, the same solvent as that of the first inorganic insulating sol can be used.

(2') Next, one main surface of a support member such as a metal foil or a resin film is coated with the second inorganic insulating sol to form the second inorganic insulating sol in a layer shape.

The coating of the second inorganic insulating sol can be performed in the same way as the coating of the first inorganic insulating sol.

(3') Subsequently, the second inorganic insulating sol is dried to vaporize the solvent.

Here, the second inorganic insulating sol contracts with the vaporization of the solvent, but the solvent is included in gaps of the solid content of the second inorganic insulating sol and is not included in the solid content itself. Accordingly, when the second inorganic insulating sol includes the fiber component having a larger volume than the inorganic insulating particle component, the area filled with the solvent is reduced as much and the amount of contraction of the second inorganic insulating sol is reduced at the time of vaporizing the solvent of the second inorganic insulating sol. That is, the contraction of the second inorganic insulating sol is regulated by the fiber component. As a result, it is possible to reduce the generation of cracks due to the contraction of the second inorganic insulating sol. Even when cracks are generated, it is possible to suppress the growth of the cracks by the use of the fiber component having a large volume, particularly, the thin and long fibers 24.

Further, when the solid content of the second inorganic insulating sol includes the fiber component by 25 vol % or more, the fiber components approach each other and many areas surrounded with the fiber components are formed. When the solvent filled in the gaps between the fiber components is vaporized in this state, the contraction of the inorganic insulating particle component occurs in the gaps and the voids V are formed while coating the fiber components with the inorganic insulating particle components. As a result, it is possible to form the voids V surrounded with the fiber components and the inorganic insulating particle components.

Further, when the fiber components are included by 25 vol % or more, the fiber components can easily approach each other. On the other hand, the solvent can easily remain in the opposing areas between the fiber components and the remaining solvent includes many inorganic insulating particle components. When the remaining solvent is vaporized, the inorganic insulating particle components included in the solvent aggregate in the opposing areas between the fiber components with the vaporization of the solvent. As a result, it is possible to interpose the inorganic insulating particle components between the fiber components. In order to excellently interpose the inorganic insulating particle components between the fiber components, the solid content of the second inorganic insulating sol preferably includes the inorganic insulating particle components by 20 vol % or more.

Further, in this way, by forming the voids V while causing the inorganic insulating particle components remain in the gaps between the approaching fiber components, it is possible to form the voids V as open voids having an opening O. As a result, it is possible to easily fill the voids V with a part of the first resin layer 18 through the openings O.

Here, when the inorganic insulating particle components included in the solvent aggregate in the opposing areas between the fiber components with the vaporization of the solvent, a small amount of inorganic insulating particle components remain in the areas in which the fiber components are coated. Accordingly, the fourth inorganic insulating particles 19d having a large particle diameter hardly remain in the areas in which the fiber components are coated and easily aggregate in the opposing areas between the fiber components. Further, when the fourth inorganic insulating particles 19d remain in the areas in which the fiber components are coated and the second inorganic insulating sol contracts with the vaporization of the solvent, the fourth inorganic insulating particles 19d having a large particle diameter easily protrude toward the void V.

Further, since the fiber components include thin and long fibers 24 and fractured particles 26 shaped in a particle form by pulverization, it is possible to raise the elastic modulus and the hardness of the inorganic insulating layer by arranging the fractured particles 26 having high elastic modulus and hardness in the voids V between the thin and long fibers 24.

Further, since the inorganic insulating particle components include the fourth inorganic insulating particles 19d having a large particle diameter and the third inorganic insulating particles 19c having a small particle diameter, the contraction of the second inorganic insulating sol in the gaps between the fiber components is regulated by the fourth inorganic insulating particles 19d and the generation of cracks in the gaps between the fiber components is further reduced.

The drying of the second inorganic insulating sol can be performed in the same way as the drying of the first inorganic insulating sol.

(4') By heating the solid content of the remaining second inorganic insulating sol, connecting the third inorganic insulating particles 19c to each other and connecting the third inorganic insulating particles 19c, the fibers 24, the fractured particles 26, and the fourth inorganic insulating particles 19d to form an inorganic insulating member 13, the base material 22 can be formed of the second inorganic insulating sol.

Here, since the particle diameter of the third inorganic insulating particles 19c is set to 110 nm or less similarly to the first inorganic insulating particles 19a, it is possible to strongly connect the third inorganic insulating particles 19c to each other and to strongly connect the third inorganic insulating particles 19c, the fibers 24, the fractured particles 26, and the fourth inorganic insulating particles 19d to each other, even at a relatively low heating temperature.

The heating of the second inorganic insulating sol can be performed in the same way as heating the first inorganic insulating sol.

In this way, the base material 22 in the fourth embodiment can be formed.

The invention is not limited to the above-mentioned embodiments, but may be modified, improved, and combined in various forms without departing from the gist of the invention. For example, the interposers in the embodiments may be replaced with each other or the first resin layers in the embodiments may be replaced with each other.

REFERENCE SIGNS LIST

1: Electronic device
2: Electronic component
3: Circuit board
4: Interposer
5a: First bump
5b: Second bump
5c: Third bump
6: Core substrate
7: Build-up portion
8: Resin substrate
9: Through-hole conductor
10: Insulator
11: Insulating layer
12: Circuit layer
13: Via conductor
14: Substrate
15a: First conductive layer
15b: Second conductive layer
16: Penetrating conductor
17a: First inorganic insulating layer
17b: Second inorganic insulating layer
18a: First resin layer
18b: Second resin layer
19a: First inorganic insulating particle
19b: Second inorganic insulating particle
19c: Third inorganic insulating particle
19d: Fourth inorganic insulating particle
20: Insulating sheet
21: Stacked board
22: Base material
23: Penetrating electrode
24: Fiber
25: Inorganic insulating member
26: Fractured particle
27: Filling portion
28: Coating portion
29: Connecting portion

What is claimed is:

1. An interposer comprising:
a substrate comprising a penetrating-hole in a thickness direction thereof;
a penetrating conductor disposed in the penetrating-hole; and
a first conductive layer being in contact with a main surface of the substrate and electrically connected to the penetrating conductor,
wherein the substrate includes first and second inorganic insulating layers separated from each other in the thickness direction, a first resin layer interposed between the first and second inorganic insulating layers and being in contact with the first and second inorganic insulating layers, and a second resin layer located in an outermost layer with which the first conductive layer is in contact,
a coefficient of thermal expansion of the first resin layer in thickness and planar directions thereof is larger than those of the first and second inorganic insulating layers, and
the second resin layer is interposed between the first conductive layer and the first inorganic insulating layer while being in contact with the first conductive layer and the first inorganic insulating layer, and has a thickness and Young's modulus smaller than those of the first resin layer.

2. The interposer according to claim 1, wherein the first and second inorganic insulating layers include first inorganic insulating particles connected to each other and having a particle diameter of 3 nm or more and 110 nm or less.

3. The interposer according to claim 2, wherein the first and second inorganic insulating layers further include second inorganic insulating particles having a particle diameter of 0.5 µm or more and 5 µm or less and connected to each other via the first inorganic insulating particles.

4. The interposer according to claim 2, wherein the first inorganic insulating particles are formed of amorphous silicon oxide.

5. The interposer according to claim 1, wherein the first resin layer has a thickness smaller than those of the first and second inorganic insulating layers.

6. The interposer according to claim 5, wherein the interposer is interposed between a circuit board and an electronic component, and electrically connecting the circuit board and the electronic component to each other.

7. The interposer according to claim 1, wherein the first resin layer includes a base material having a smaller coefficient of thermal expansion in the planar direction than a coefficient of thermal expansion in the thickness direction.

8. The interposer according to claim 7, wherein the interposer is interposed between a first electronic component and a second electronic component separated from each other in the thickness direction, and electrically connecting the first and second electronic components to each other.

9. The interposer according to claim 7, wherein the base material includes a plurality of fibers and inorganic insulating members connected to each of neighboring fibers at an approaching position between the neighboring fibers.

10. The interposer according to claim 1, wherein the penetrating conductor is filled in the penetrating-hole.

11. An electronic device, comprising:
a circuit board;
an electronic component mounted on the circuit board; and
the interposer according to claim 1, the interposer being interposed between the circuit board and the electronic component, and electrically connecting the circuit board and the electronic component to each other.

12. The electronic device according to claim 11, wherein the interposer has a thickness smaller than those of the circuit board and the electronic component.

13. An electronic device, comprising:
first and second electronic components separated in the thickness direction; and
the interposer according to claim 1, the interposer being interposed between the first and second electronic components, and electrically connecting the first and second electronic components to each other.

14. The electronic device according to claim 13, wherein the interposer has a thickness smaller than those of the first and second electronic components.

* * * * *